United States Patent [19]
Weber et al.

[11] Patent Number: 6,096,086
[45] Date of Patent: *Aug. 1, 2000

[54] METHOD AND SYSTEM FOR VEHICLE DESIGN USING OCCUPANT-TO-VEHICLE INTERACTION

[75] Inventors: William Francis Weber, Bloomfield Hills; Daniel Cornelius Bach, Belleville; Joseph J. Moon, Livonia; Frederick Abraham Karam, Allen Park; Sean James Sevrence, Temperance; Scott Ming-Hua Tang; Michael Joseph Walraven, both of Ypsilanti; Mark Russell Henault, Milford, all of Mich.

[73] Assignee: Ford Global Technologies, Inc., Dearborn, Mich.

[*] Notice: This patent is subject to a terminal disclaimer.

[21] Appl. No.: 08/984,754
[22] Filed: Dec. 4, 1997
(Under 37 CFR 1.47)

[51] Int. Cl.[7] .............................. G06F 17/50; G06F 9/455
[52] U.S. Cl. ................................... 703/8; 703/1; 345/419
[58] Field of Search ................ 395/500.01, 500.37, 395/500.29; 345/333, 348, 353, 356, 419, 473, 339, 355; 364/148.01, 149, 150, 151, 152, 468.01, 468.02, 468.03, 468.04, 468.09, 468.1, 468.12; 180/271, 286, 287; 280/1; 434/29, 257, 267, 365, 370, 373; 382/104

[56] References Cited

U.S. PATENT DOCUMENTS

| | | | |
|---|---|---|---|
| 4,439,824 | 3/1984 | Mayer | 700/30 |
| 4,625,329 | 11/1986 | Ishikawa et al. | 382/104 |

(List continued on next page.)

FOREIGN PATENT DOCUMENTS

| | | |
|---|---|---|
| 0 401 900 A1 | 5/1990 | European Pat. Off. . |
| 2 240 414 | 12/1990 | United Kingdom . |

OTHER PUBLICATIONS

R.W. McLay et al., "Ergonomics, spinal injury, and industrial vehicle safety", Proceedings of the 1996 Fifteenth Southern Biomedical Engineering Conference, 1996, pp. 191–194.

(List continued on next page.)

*Primary Examiner*—Eric W. Stamber
*Assistant Examiner*—Russell W. Frejd
*Attorney, Agent, or Firm*—David B. Kelley

[57] ABSTRACT

A computer based system and method for designing an automotive vehicle orients an occupant representation, in electronic form, with respect to a three-dimensional electronic representation of a portion of the vehicle. At least one vehicle system is represented, also in electronic form, with respect to a common reference point, at least one human factors occupant-to-vehicle interaction study is electronically performed to determine occupant interaction with at least one vehicle system, and an outcome of that study is reported to a vehicle designer. The designer then has an option to vary, or alter, the occupant orientation, the location of the vehicle system, or both, so that the design meets a predetermined interaction criteria of the study. However, the designer may opt to retain the design despite non-compliance with the interaction criteria. If a parameter change is made, the system and method automatically rebuild every other effected dimension, and vehicle systems to satisfy the regenerated design are automatically selected from an electronic parts library so that packaging alternatives can be quickly studied. A geometric representation of occupant-to-vehicle interaction relative to a vehicle system may be displayed to allow a designer to visually assess compliance with a particular interaction criteria. The occupant representation, vehicle, vehicle system, and geometric representation of the occupant-to-vehicle interaction may be rendered and animated in three-dimensions permitting views from various perspectives. The method and system can quickly provide accurate human factors occupant-to-vehicle studies for a vehicle design while allowing system packaging flexibility.

63 Claims, 27 Drawing Sheets

(21 of 27 Drawing Sheet(s) Filed in Color)

U.S. PATENT DOCUMENTS

| | | |
|---|---|---|
| 4,811,240 | 3/1989 | Ballou et al. .......................... 345/334 |
| 4,912,657 | 3/1990 | Saxton ................................... 345/356 |
| 5,033,014 | 7/1991 | Carver et al. .............................. 703/1 |
| 5,070,534 | 12/1991 | Lascelles et al. ..................... 345/348 |
| 5,111,413 | 5/1992 | Lazansky et al. ....................... 703/16 |
| 5,189,626 | 2/1993 | Colburn ................................ 700/182 |
| 5,197,120 | 3/1993 | Saxton et al. ......................... 345/439 |
| 5,293,479 | 3/1994 | Quintero et al. ...................... 345/353 |
| 5,481,465 | 1/1996 | Itoh ..................................... 700/118 |
| 5,590,268 | 12/1996 | Doi et al. ............................. 345/326 |
| 5,729,463 | 3/1998 | Koenig et al. ........................... 700/98 |
| 5,761,063 | 6/1998 | Jannette et al. .......................... 700/97 |
| 5,799,293 | 8/1998 | Kaepp ..................................... 706/45 |
| 5,844,554 | 12/1998 | Geller et al. ......................... 345/333 |

OTHER PUBLICATIONS

S. Aono, "The Next Step in Automotive Electronic Control", International Congress on Transportation Electronics, 1988, Convergence 88, pp. 83–89.

M. Asano et al., "New Approach in Automotive Control—An Experimental Variable–Response Vehicle", 1991 International Conference on Industrial Electronics, Control and Instrumentation 1991, IECON 91, pp. 123–128.

P.A.J. Barham et al., "Ergonomic and Safety Implications of In–Car ATT Devices—Evidence from Field Trials with Elderly Drivers", IEE Colloquium on Design of the Driver Interface, 1995, pp. 4/1–4/3.

A. Pauzie et al., "Ergonomic Evaluation of a Prototype Guidance System in an Urban Area. Discussion about methodologies and data collection tools", Vehicle Navigation and Information Systems Conference, 1995, In Conjunction with the Pacific Rim TransTech Conference, 6th International VNIS, pp. 390–396.

J.L. Campbell, "Development of Human Factors Design Guidelines for Advanced Traveler Information Systems (ATIS)", Vehicle Navigation and Information Systems Conference, 1995, In Conjunction with the Pacific Rim TransTech Conference, 6th International VNIS, pp. 161–164.

J. Laird Evans et al., "In–Vehicle Man–Machine Interaction—the Socrates approach", Vehicle Navigation anf Information Systems Conference 1994, pp. 473–477.

T.S. Abbott et al., "Functional Catagories for Human–Centered Flight Deck Design", Digital Avionics Systems Conference, 1993, 12th DASC, AIAA/IEEE, pp. 66–74.

E.J. Hartzell et al., "Computational Human Factors in Human–Machine Engineering—The Army–NASA Aircrew/Aircraft Integration (A/sup 3/I) Program", Proceedings of the IEEE 1988 National Aerospace and Electronics Conference, 1988 NAECON 1988, pp. 819–822.

SAE J903c, Nov. 1973—"Passenger Car windshield Wiper Syhstems".

SAE J1052, May 1987—"Motor Vehicle Driver and Passenger Head Position".

SAE J100, Mar. 1988—"Passenger Car Glazing shade Bands".

SAE J287, Jun. 1988—"Driver Hand Control Reach".

SAE J1516, Mar. 1990—"Accommodation Tool Reference Point".

SAE J1517, Mar. 1990—"Driver Selected Seat Position".

SAE J1521, Mar. 1990—"Truck Driver Shin–Knee Position For Clutch and Accelerator".

SAE J1522, Mar. 1990—"Truck Driver Stomach Position".

SAE J826, Jun. 1992—"Devices for Use in Defining and Measuring Vehicle Seating Accomodation".

SAE J941, Jun. 1992—"Motor Vehicle Drivers' Eye Locations".

SAE J902, Apr. 1993—"Passenger Car Windshield Defrosting Systems".

SAE J198, Jun. 1993—"Windshield Wiper Systems—Trucks, Buses, and Multipurpose Vehicles".

SAE J1100, Jun. 1993—"Motor Vehicle Dimensions".

SAE J1050—Describing and Measuring the Driver's Field of View.

*"Automating Design in Pro/Engineer with Pro/Program"*, Mark Henault, Sean Sevrence and Mike Walraven (Onword Press) 1997.

Chrysler Puts Comfort in the Front Seat with Ilog Tools (S. Alexander) Internet Web Site http://www.infoworld.com/pageone/special/eccase042296.htm (Internet publication date unknown).

Inspec acc. No. 2832913, SAMMIE: a computer aided design tool for ergonomists, Proc. Human Factors Soc. $30^{th}$ meeting, vol. 1, pp. 695–698, Dayton Ohio, Sep. 29–Oct. 3, 1986.

Inspec acc. No. 4408183, Use of ergonomic workspace modelling in vehicle design, CAES '92, pp. 145–152, 1992.

Techmath releases RAMSIS 3.4 Human–Modeling Software, at www.nasatech.com/NEWS/techmath_0119.html.

METHOD AND SYSTEM FOR VEHICLE DESIGN USING OCCUPANT-TO-VEHICLE INTERACTION

FIELD OF THE INVENTION

The present invention relates to computer aided automotive vehicle design, in general, and more specifically to vehicle design based on occupant-to-vehicle interaction.

BACKGROUND OF THE INVENTION

Vehicle design has advanced to a state in which occupant comfort and convenience, sometimes called ergonomics or human factors, is on at least an even par with the transportive aspects of a vehicle. This evolution has been driven by the availability of new technologies, including instrument panel clusters, adjustable steering wheels and columns, vehicle electronics, and movable seats, to mention only a few. With the addition of each new technology to the automotive vehicle environment, however, has come additional complexity in packaging the various occupant appurtenances to best achieve both design and ergonomic functionality.

One aspect of this packaging task is to provide an occupant, particularly a vehicle driver, with sufficient space between adjacent vehicle systems. That is, a vehicle design goal is to locate vehicle systems and vehicle structure, such as a manual gear shift, a knee bolster, a steering column and steering wheel, a seat, a hand brake, a door trim armrest, the inner roof, and the like, so that an occupant has adequate appendage clearance for system operation or for a comfortable environment. Current practice relies on various methods to determine whether a proposed design meets preferred occupant-to-vehicle interaction requirements. Typically, a proposed design is analyzed in two-dimensions which requires many "cuts" of a drawing. A three-dimensional "buck" is also used to give a better overall view of the design, but such physical representations are expensive, time consuming, and difficult to modify for a subsequent design. Since there may be many individual components which affect occupant interaction, the tasks associated with capturing all of the required human interaction factors packaging requirements are daunting. For example, a single knee bolster study, which determines whether knee bolster placement allows adequate leg room, can require several hours to complete. In total, performing human factors interaction studies typically requires many weeks under current practice, assuming the availability of experienced analysts to conduct all of the individual studies.

An additional problem with current design practice is that it leaves room for errors, due to the complex instructions required to perform the studies. Current design practice also is inflexible in that a change in one component, even a minor component, requires all human factors interaction studies to be redone, resulting in greater expense and delay of design completion.

SUMMARY OF THE INVENTION

The present invention overcomes the deficiencies of current vehicle design practice by providing a method and system which can quickly provide accurate human factors interaction studies for a vehicle design while allowing system packaging flexibility. The computer based system and method of the present invention orients an occupant representation, in electronic form, with respect to a three-dimensional electronic representation of a portion of the vehicle. At least one vehicle system is represented, also in electronic form, with respect to a common reference point. At least one human factors interaction study is performed to determine occupant interaction with respect to at least one vehicle system, and an outcome of that study is reported to a vehicle designer. The designer then has an option to vary, or alter, the occupant orientation, the location of the vehicle system, or both, so that the design meets the interaction criteria of the study. However, the designer may opt to retain the design despite non-compliance with the interaction criteria. In addition, a geometric representation of occupant interaction relative to a vehicle system may be displayed to allow a designer to visually assess compliance with a particular interaction criteria. The occupant representation, vehicle, vehicle system, and geometric representation of the occupant interaction may be rendered and animated in three-dimensions permitting views from various perspectives.

An advantage of the present invention is a method and system for vehicle design which considerably reduces vehicle design time and expense.

Another advantage of the present invention is a method and system for vehicle design which can be applied to any vehicle system, device, or component which interacts with a vehicle occupant.

Yet another advantage of the present invention is a method and system which can be applied to any vehicle system which interacts with an occupant.

Still another advantage of the present invention is a vehicle design method and system which allows study of vehicle packaging feasibility early in the design process.

Another advantage of the present invention is a vehicle method and system which supports computer aided engineering (CAE) analysis and rapid prototyping.

Another advantage is a method and system for vehicle design which provides informed design decision making which supports vehicle program timing, and which reduces late design changes.

Yet another advantage of the present invention is a vehicle design system and method which provides flexibility in vehicle design while not being constrained by timing requirements imposed in traditional prototype design development.

Still yet another advantage is a vehicle design system and method which provides generic, ergonomically sound parametric automated design of various portions of a vehicle.

A feature of the present invention is a vehicle design system and method which provides accelerated, three-dimensional solid modeling of automated interaction studies in packaging of vehicle systems.

Another feature of the present invention is the ability of a vehicle designer to easily alter any factor with the result that the system and method automatically rebuild every other effected dimension so that packaging alternatives can be quickly studied.

BRIEF DESCRIPTION OF THE DRAWINGS

The file of this patent contains at least one drawing executed in color. Copies of this patent with color drawings will be provided by the Patent and Trademark Office upon request and payment of the necessary fee.

The objects, advantages, and features of the present invention will be apparent to those skilled in the art upon reading the following description with reference to the accompanying drawings, in which.

DETAILED DESCRIPTION OF THE PREFERRED EMBODIMENT

Figure 1:
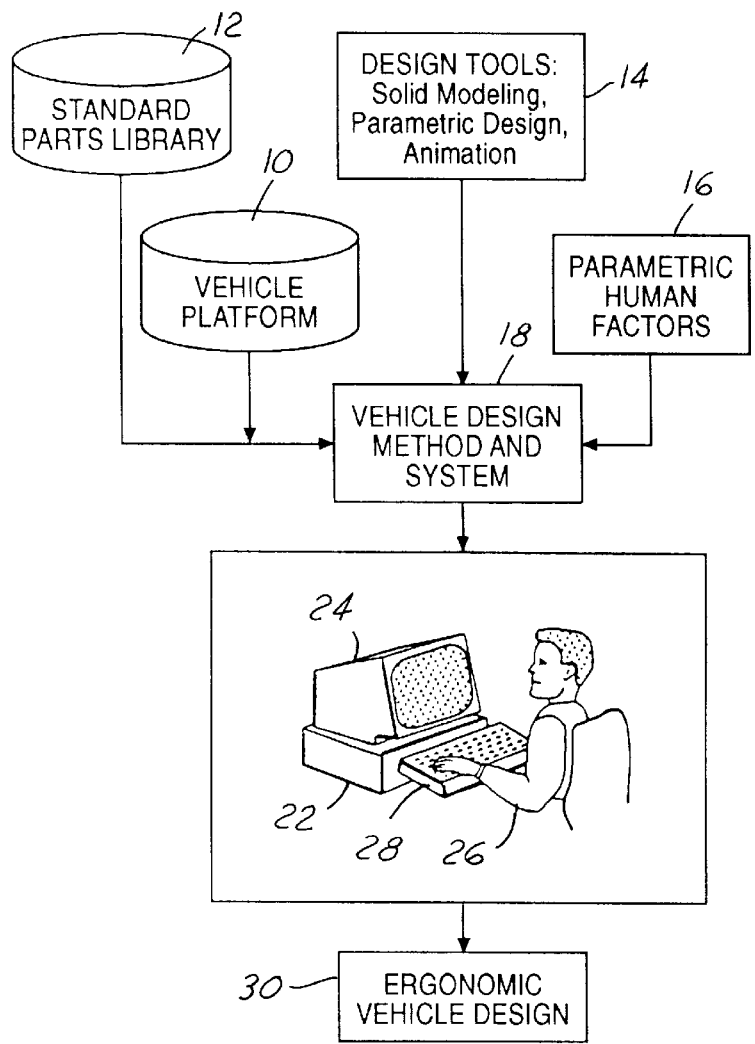
FIG. 1 is a flow chart illustrating various parts of a system for designing an automotive vehicle according to the present invention.

Automotive vehicle design, and in particular design with respect to occupant interaction of a portion of an automobile, is achieved according to the present invention with a generic, parametric driven design process. This process allows flexibility in vehicle design, including performance of numerous ergonomic occupant-to-vehicle interaction studies in a small fraction of the time required with conventional vehicle design. The present invention enables an acceptable design to be achieved in minutes, as opposed to days and weeks previously required. Various computer based tools are integrated to achieve this enormous time and expense savings, including solid modeling, parametric design, automated studies, and a non-parametric component library, sometimes called a standard parts library. Referring to FIG. 1. the tools used by the method and system of the present invention are shown graphically. Vehicle platforms are electronically represented on an electronic storage device 10, which includes representation of vehicle sheet metal, for example. A standard parts library 12, also stored on an electronic medium, has electronic representations of production parts, generic parts, and others. Various design tools, shown generally at 14, can be used for this packaging task. Packaging studies with these parts can be done to assess many factors, including the potential for reuse and complexity reduction. Solid modeling takes electronically stored vehicle platform data and standard parts data and builds complex geometry providing part-to-part or full assembly interference checking. Several commercial solid modeling programs are available and generally known to those skilled in the art, such as Pro/Engineer® and IDEAS®. Solid modeling also allows three-dimensional visualization through use of rendering and animation systems, such as Visilab®, while being compatible with other computer aided engineering and rapid prototyping computer applications.

Parametric design is used in the electronic construction of vehicle geometry within a computer for ergonomic interaction studies of components and assemblies. As certain dimensions, or parameters, are modified, the computer is instructed to regenerate a new vehicle or part geometry. The parametric human factor interaction studies, generally shown at box 16, control and limit the design process in accordance with ergonomically desirable parameters, as is further discussed below.

Still referring to FIG. 1, the computer implemented method and system of the present invention, shown at box 18, advantageously combines all of the foregoing to provide an efficient, flexible, rapid design for a vehicle, or a portion of a vehicle, which meets predefined ergonomic interaction requirements. As seen in FIG. 1, the present invention is implemented on a computer system 22, including a processor and a memory, which can provide display and animation of vehicle, occupant, and vehicle part electronic representations on a display such as a video terminal 24. Parameter selection and control for the design method can be accomplished by a user 26 via a keyboard 28, or other user interaction device, such as a mouse or a SpaceBall™. One input method could include a pop-up window with all current parameters, including an on-line description for the parameter and a current value therefor. Other input methods will occur to those skilled in the art. For example, parametric values may be picked from a table within a two-dimensional mode since some vehicle designers prefer to view an assembly in sections which can be laid out on a drawing. A vehicle design 30 enhanced by human factors ergonomic studies is an output of the current invention.

Figure 2:
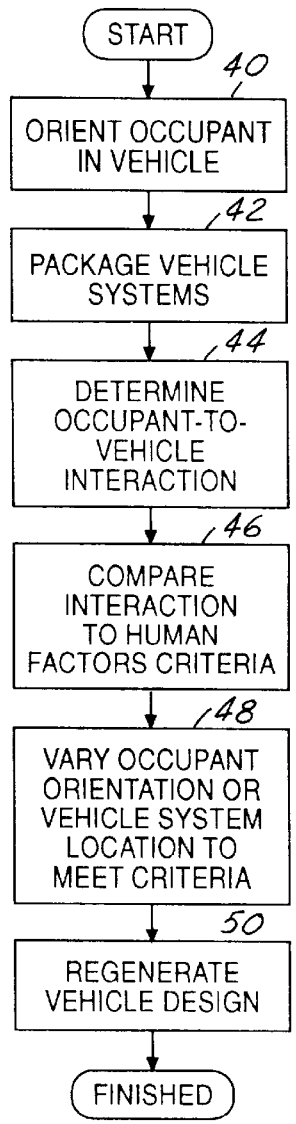
FIG. 2 is a flow chart of one embodiment of a method for designing a vehicle according to the present invention.
Figure 3:
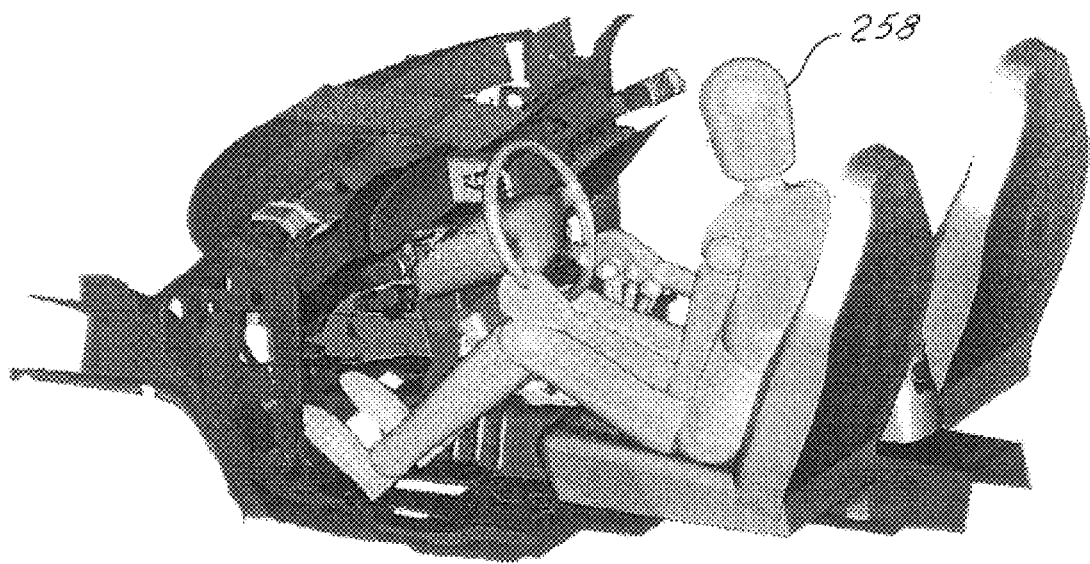
FIG. 3 is a color perspective view of a portion of an automotive vehicle having an occupant representation situated thereon representing a 95% male.
Figure 4:
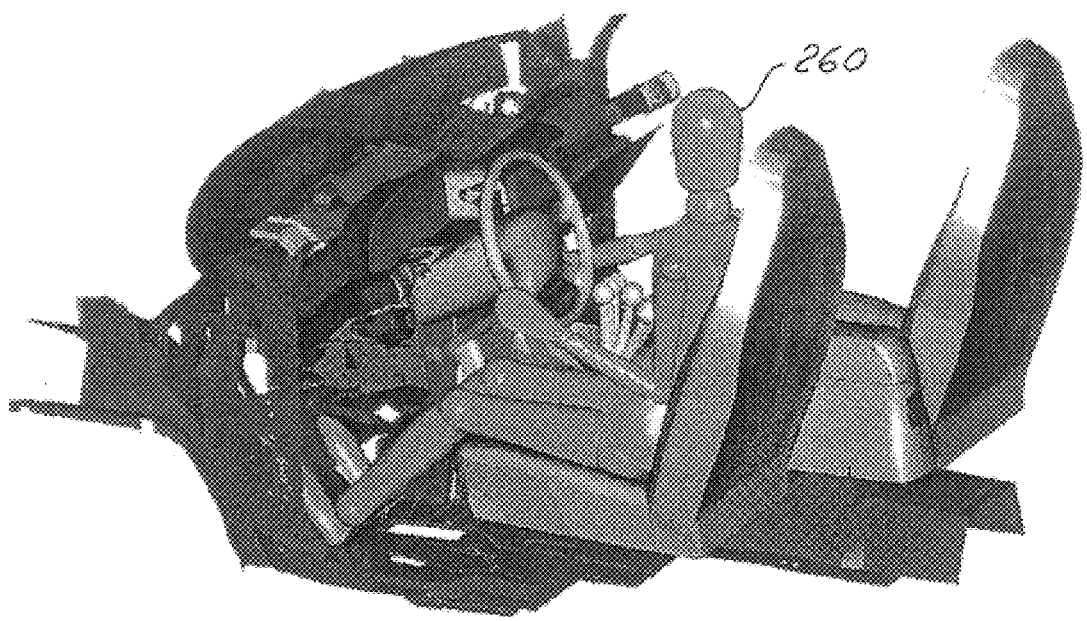
FIG. 4 is a color perspective view of a portion of an automotive vehicle having an occupant representation situated thereon representing a 5% female.

Turning to FIG. 2, a flowchart of a method according to the present invention is shown. A vehicle platform is selected so that an electronic representation of vehicle sheet metal, including a floor plan, is available (FIGS. 3 and 4). It should be understood that use of the term vehicle in this disclosure implies an electronic representation of at least a portion of at least a portion of a vehicle, for example the floor pan sheet metal. Vehicle platform selection is optional, it being understood that occupant orientation and vehicle system packaging, as next described, need only be situated with respect to a common referenced point.

In box 40 of FIG. 2, an occupant representation is oriented in the vehicle. For purposes of this disclosure, orientation of an occupant means specifying or selecting values for a set of occupant position parameters which represent various occupant locations with respect to the vehicle. These occupant position parameters may include data for the three-dimensional location of an occupant hip point, a distance between an accelerator heel point and the occupant hip point, and occupant back angle. Selection of an occupant type, for example, may also be important so that occupant attributes, such as arm length and head height, are known. Various occupant types may be selected, including that for a 95% male 258 (FIG. 3 ) and the 5% female 260 (FIG. 4). Representation of an occupant in the form of a mannequin, as is done in many of the drawings herein disclosed, including FIGS. 3 and 4, is for user convenience only and is not necessary for operation of the method and system of the present invention. Rather, selection of certain occupant orientation parameters is all that is required. Those skilled in the art will recognize that other occupant position parameters may also be used, and that only one, or a combination of parameters, may be required to orient an occupant representation within the vehicle. Selection will depend on the particular human factors study to be performed.

After the occupant has been oriented as described above, various systems, devices, or components are then packaged on the vehicle (box 42, FIG. 2). For purposes of this disclosure, packaged means that an electronic representation of the dimensions of the system, device, or component are geometrically related to the vehicle three-dimensional electronic reference frame, coordinate system, or reference point. These systems may include, but are not limited to, instrument panel clusters, electronic clusters, including radios, tape players, and CD's, heating, ventilation, and air conditioning (HVAC) control panels and outlet ducts, door trim, glove box, air bags, knee bolsters, a steering wheel and column, a center console, a manual shift device, and seats. Vehicle systems is intended to include any part of the vehicle which will interact with an occupant, either directly or indirectly. Those skilled in the art will recognize that the foregoing list is intended to be illustrative only and not exhaustive. It should also be understood that occupant orientation (box 40) and packaging of vehicle systems (box 42) need not be accomplished in the order indicated in FIG. 2, but can be done in reverse order, or intermingled, that is, various systems may be packaged, the occupant oriented within the vehicle, and other systems subsequently packaged.

After the occupant is oriented and the vehicle systems are initially packaged as described above, occupant interaction with respect to various vehicle systems is then determined (box 44. FIG. 2). Occupant interaction may be determined in many ways, for example generating interaction geometries, including distances, surfaces, and zones. The interaction geometries may represent, but are not limited to, a steering wheel hand clearance surface, an arm rest surface, a leg clearance surface, a steering wheel finger interaction surface, a hand brake path and clearance surface, a hand clearance around a seat surface, a manual shifter surface, a multifunction stalk surface, a pelvic positioning surface, a door trim speaker location surface, and a knee bolster surface. The aforementioned occupant interaction geometries are determined with the design tools described above, including solid modeling, parametric design and animation. Those skilled in the art will understand that other design tools may also be used to determine various occupant interactions with the vehicle systems.

Three dimensional geometric interaction between an occupant and vehicle systems may be generated. These interactions may then be communicated to the user, such as by reporting or displaying. Animation on a video screen in three-dimensions with different colors representing various vehicle systems, occupant representations, and occupant interactions can be used to effectively communicate study results. However, a printed report of the occupant-to-vehicle interaction, such as whether occupant movement is obstructed by a vehicle system, may be sufficient.

Still referring to FIG. 2, when occupant interactions have been determined, they may be compared to a set of human factors interaction criteria, as shown in box 46. The human factors criteria comprise a set of data or information which specifies a preferred occupant interaction. Such interaction criteria may include, for example, the requirement that an driver's hand clutching a manual gear shifter knob not touch any vehicle system when moved between available gear positions. Numerous other human factors interaction criteria can be used in the comparison of box 48. The comparison may be done visually, such as viewing an occupant-to-vehicle interaction from various perspectives of the vehicle, occupant, and vehicle systems. For example, interaction solids may be displayed to show whether expected occupant movement will interfere with a vehicle system or systems. The solids so displayed form interaction zones such that vehicle system controls, such as buttons, which do not interfere with occupant movement, appear outside of the interaction zone, while those controls which may interfere with occupant movement appear in the interaction zone.

If an occupant-to-vehicle interaction does not meet a corresponding human factors interaction criteria, adjustment to the vehicle design can be made by varying the occupant orientation, the vehicle systems locations, or both, or any generic parameter, as shown in box 48 (FIG. 2). Adjustment of the various parameters may be non-iteratively performed, that is, a vehicle designer may change one or more of the parameters based on past design experience in a single step, or steps. Alternatively, the steps of FIG. 2 may be iteratively performed until an acceptable design is achieved or a conclusion is made that such a design is not possible. Variation of the parameters may be conducted interactively through user 26 input (FIG. 1). It should be understood that variation of the occupant orientation or the vehicle systems is optional and that the human factors interaction criteria may or may not be required to be met.

When a change is made to the occupant orientation, a vehicle system, or any design parameter, for example a locational change with respect to the chosen coordinate system, regeneration of the entire vehicle design is electronically performed (box 50 of FIG. 2). During this regeneration step, appropriate relationships between the occupant representation, the vehicle systems, and the vehicle are automatically determined, and vehicle systems are automatically changed according to the revised parameters. That is, the method and system of the present invention will automatically rebuild every other affected dimension so that packaging alternatives can be quickly studied. In the regeneration step, originally selected vehicle systems or devices may need replacement to fit with the new design. This replacement is automatically done by selection of vehicle systems or devices from the electronic parts library to meet the vehicle system change, for example a locational change.

It should therefore be understood that some changes to a vehicle design are selected by a vehicle designer, as discussed above and further discussed below with respect to FIG. 13, while other changes are accomplished automatically by the system and method of the present invention to accommodate designer specified changes. This feature allows packaging alternatives to be quickly studied.

Figure 5:
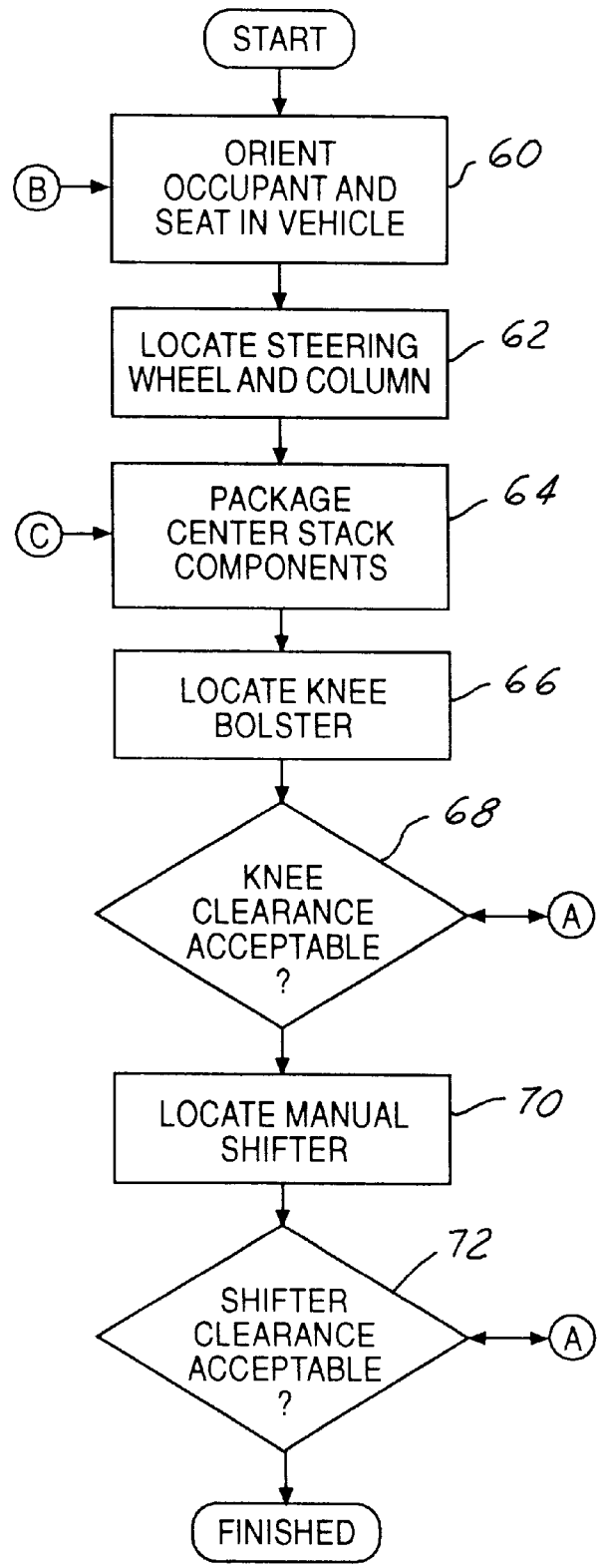
FIG. 5 is a flow chart of an embodiment of a method for designing a vehicle according to the present invention.
Figure 6:
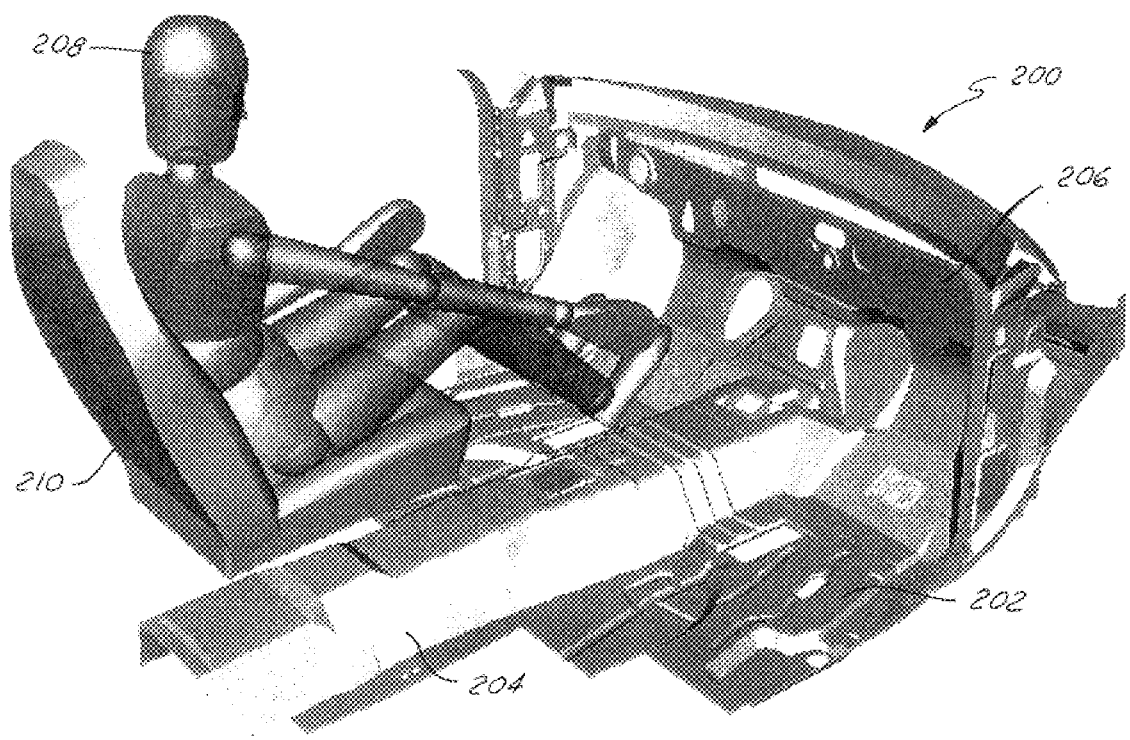
FIG. 6 is a color perspective view of a portion of an automotive vehicle showing an occupant representation oriented on a seat therein.

Turning now to FIG. 5, a detailed example of one embodiment of the method of the present invention is shown. As seen in FIG. 6, a vehicle platform 200, shown in light gray, is selected to generate a three-dimensional, electronic representation of a floor pan 202, a transmission tunnel 204, and a front wall 206 (all shown in light gray). It should be understood that selection and display of the vehicle platform 200 shown in FIG. 6 is optional and not required for the method of the present invention. Selection of a vehicle platform may be from a list of vehicle platforms and will determine the three-dimensional coordinates of the platform in an electronic form as represented in the memory of the computer 22 (FIG. 1).

After selection of the vehicle platform, an occupant representation 208, shown in yellow in FIG. 6, is orientated in the vehicle as depicted in box 60 of FIG. 5. Orientation of the occupant representation 208 is accomplished as described above. This orientation includes selection of an occupant type which determines an occupant arm length, and thus an occupant interaction. For example, selection of a 5% female occupant type determines a torso length between a hip point and a shoulder point for a female representing the smallest 5% of the female population, in addition to an arm length from the shoulder point to a hand point for such a female. A leg length is also determined, as well as a heel point. These lengths are related to the vehicle reference frame, or to a common reference point, through the various occupant orientation parameters, for example, the occupant hip point.

Still referring to box 60 (FIG. 5), a seat 210 (orange, FIG. 6) is next located with respect to the vehicle platform 200 and the occupant representation 208, and the location of the seat 210 with respect to the occupant 208 will in part determine the type of seat which may be used in construction of the vehicle. Location of the seat may not be required for some of the occupant-to-vehicle interaction studies of the present invention.

Figure 7:
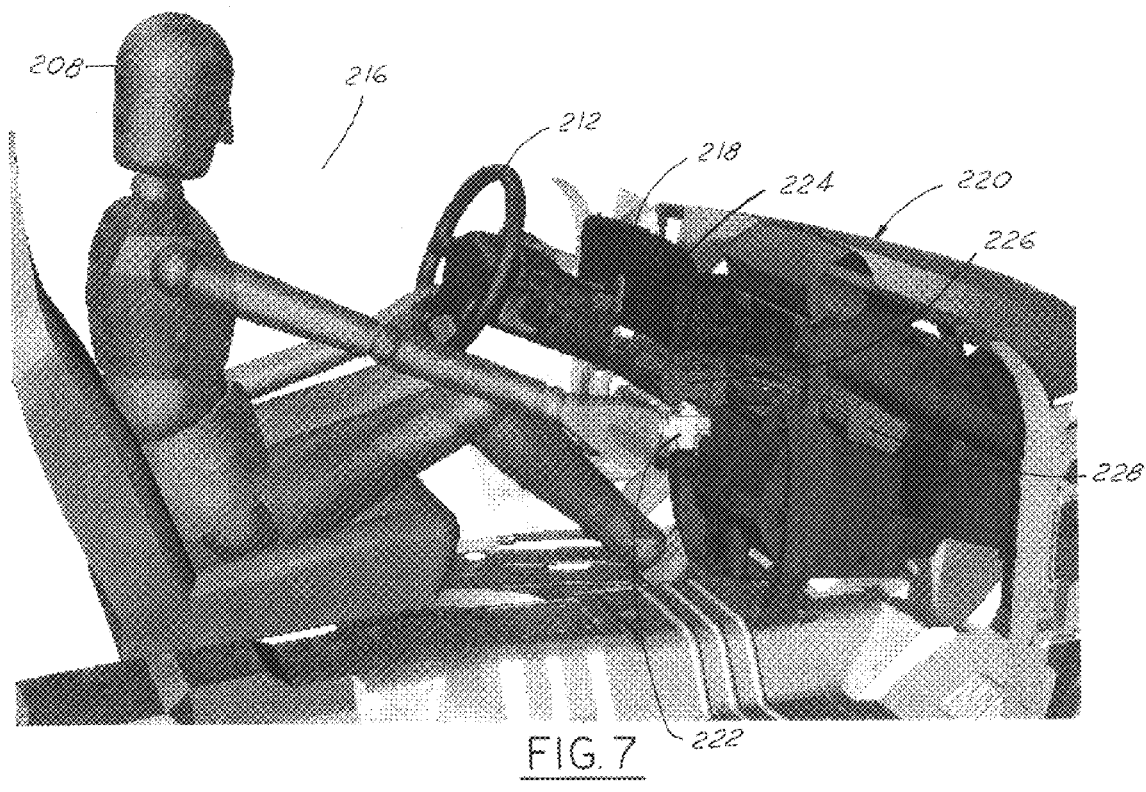
FIG. 7 is a color perspective view showing packaging of a steering column and steering wheel according to the present invention.

After the seat 210 has been located, a steering wheel 212 and steering column 214 (shown in green FIG. 7) can be located (box 62 of FIG. 5), but may or may not be necessary for performing the interaction studies of the present invention. As with all of the systems packaged by the method of the present invention, the steering wheel and column may be selected from a list of electronic representations of those parts. The steering wheel and column are located such that the occupant in the driver's seat is able to access and easily use the steering wheel 212. An instrument panel cluster is next packaged, preferably by performing a rimblock study which determines, electronically, a zone which is obstructed from the driver's view in the forward direction by the steering wheel and steering wheel hub. This zone is referred to as a rimblock zone 216 (shown as yellow and green in FIG. 7) and is used for proper placement of an instrument panel cluster containing gauges and other vehicle performance indicating devices. The IP cluster 218 (purple. FIG. 7) is preferably placed out of the rimblock zone 216. The IP cluster 218 is positioned so that important portions of the gages and indicating devices do not fall into the rimblock area. Placement of the IP cluster 218 may be optional for occupant-to-vehicle interaction human factors studies of this invention.

The center stack components are next packaged (box 64 of FIG. 5). The center stack, generally indicated at 220 (FIG. 7), is that portion of the instrument panel in the center of the vehicle typically containing a panel, or panels, having instrument controls for vehicle audio electronics 222 (light yellow), HVAC controls 224 (black), and the like. The center stack may also contain HVAC outlets 226 (pink). It should also be understood that other HVAC outlets 228 (pink) and instrument panel controls may also be packaged during this step of the method of the present invention, for example, lighting controls for both the exterior and interior may be located outboard of the steering column on the instrument panel. Packaging of these components for purposes of this disclosure means selecting a device, component, or system and electronically representing such in a location proximate other vehicle structure so as not to interfere with adjacent components or structure. If interference is detected during packaging, an appropriate indication is given to the user.

Figure 8:
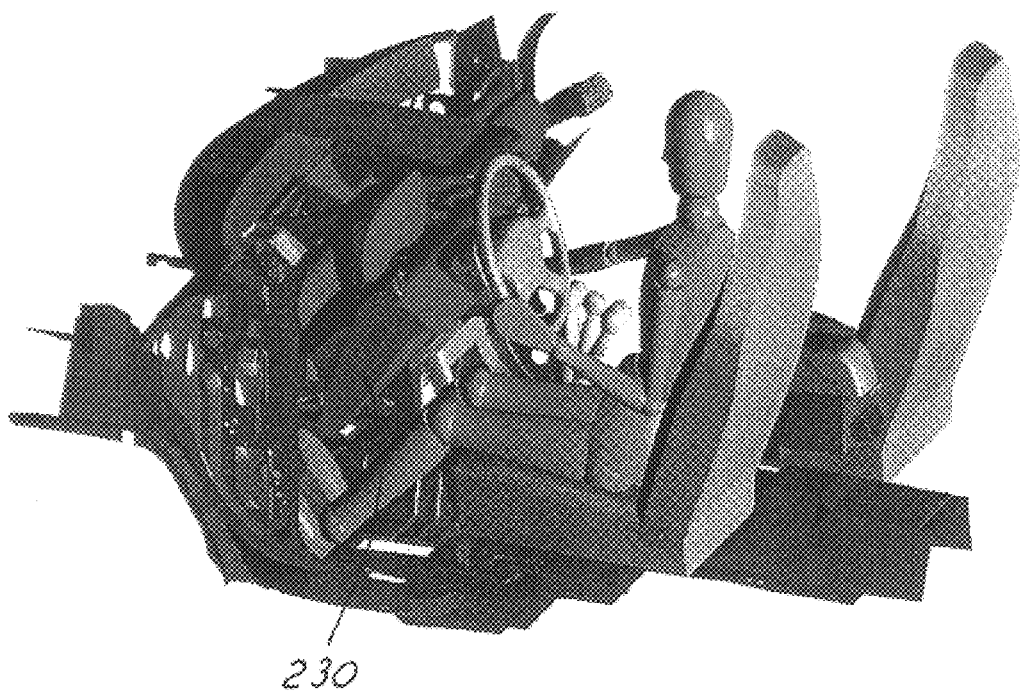
FIG. 8 is a color perspective view of a knee bolster zone for determining occupant interaction with a knee bolster.
Figure 9:
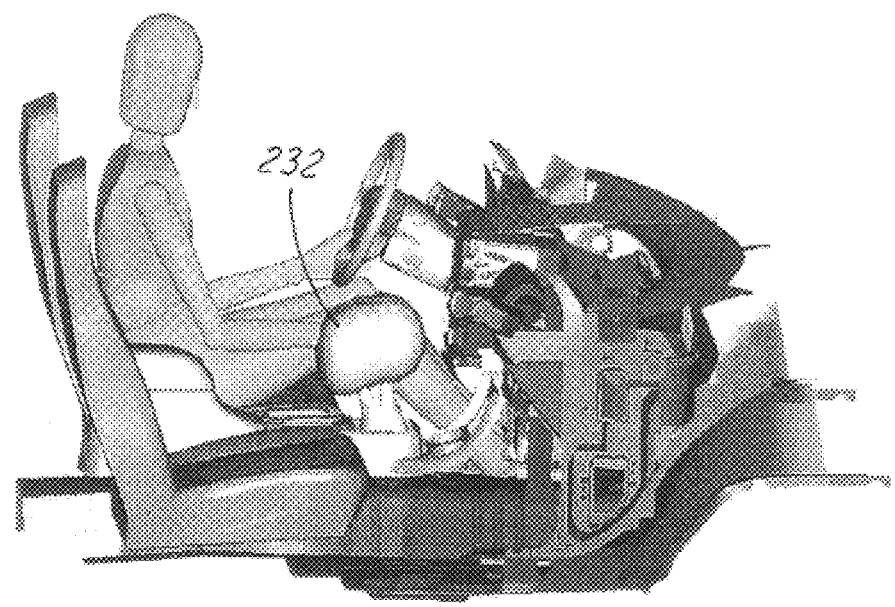
FIG. 9 is a color perspective view showing a manual transmission hand clearance envelope for determining occupant interaction with vehicle systems when manually shifting the transmission.

After the instrument panel components, devices, and systems have been packaged, various studies may be electronically performed to determine whether the package is satisfactory from a human factors criteria standpoint. Such studies may include, for example, a knee bolster clearance study created by a knee bolster zone 230 (green in FIG. 8), and a manual shifter hand and boot clearance study created by a manual hand shifter envelope 232 (white in FIG. 9). Other zones may also be made.

Figure 10:
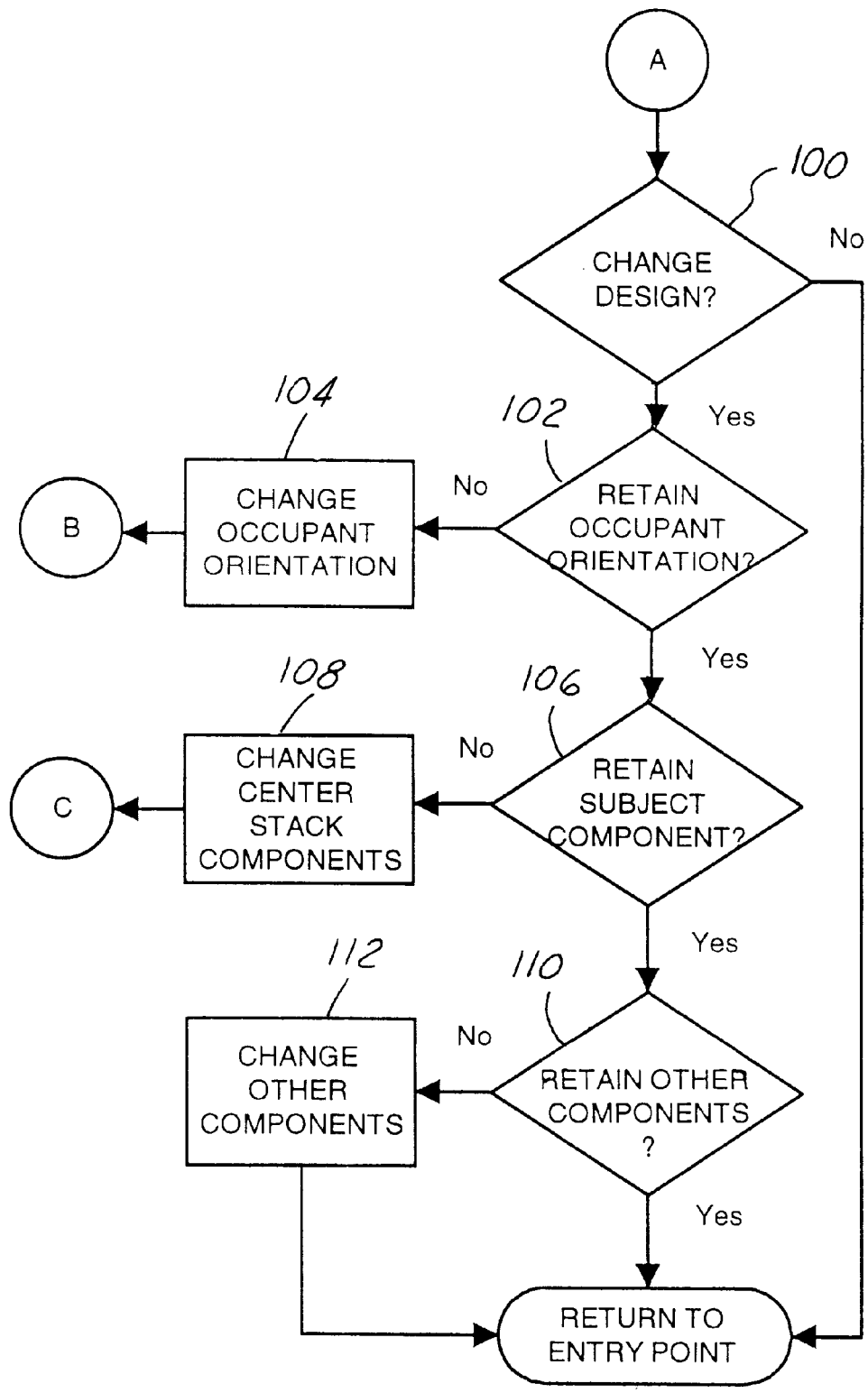
FIG. 10 is a flow chart showing a design change process optionally used with the vehicle design method according to the present invention.

At box 66 in FIG. 5, a knee bolster study is performed, similar to that discussed above. Should the packaging be unacceptable from a human factor perspective, vehicle design alteration may be made. A design alteration determination flow chart, as shown in FIG. 10, can be used to perform changes to vehicle design, if any. In the first decisional diamond 100 of FIG. 10, the desire for design change is questioned. If the decision is made not to change vehicle design despite it not meeting designated human factor criteria, the flow is returned to the entry point from the flow chart in FIG. 5. Such a decision may be made, for example, when non-ergonomic considerations outweigh the desirability of design change for ergonomic reasons.

Continuing with FIG. 10, should there be a desire to investigate changing the vehicle design, retention of the current occupant orientation is made in the second decisional diamond 102. If it is determined not to retain the current occupant orientation, then a change is made thereto in box 104, and the flow is returned to entry point B in the flow chart of FIG. 5. If it is determined to retain the current occupant orientation, the flow in FIG. 10 moves to the third decisional diamond 106 where it is determined whether to retain the current packaging configuration of the center stack components. If it is determined not to retain these current center stack components, the change is made in box 108 and the flow is returned to entry point C in the flow chart of FIG. 5. It should be noted that a change to the packaging arrangement of the center stack components, alone or in conjunction with a change to the occupant orientation, may be made to meet a given interaction criteria. However, if it is determined to retain the current packaging of the center stack components, the flow in FIG. 10 goes to the fourth decisional diamond 110 wherein it is determined to retain other vehicles components. If it is determined not to retain other vehicle components, then those components, or a subset thereof, are changed in box 112 and the flow returns to the entry point in the flow chart of FIG. 5, that is, the point in FIG. 5 which routed decisional flow to FIG. 10. However, if it is determined to retain the other vehicle components, then flow is returned to entry point A in the flow chart of FIG. 5 without any changes having been made to the vehicle design. It should be understood that the just described vehicle design change flow chart of FIG. 10 is optional, that the method and system of the current invention need not employ such a design change method or means for accomplishing such, and that the order of changes in FIG. 10 may vary. It should further be noted that there are numerous possibilities for design change flow chart logic, and that FIG. 10 is meant to be illustrative and not limiting.

Figure 11:
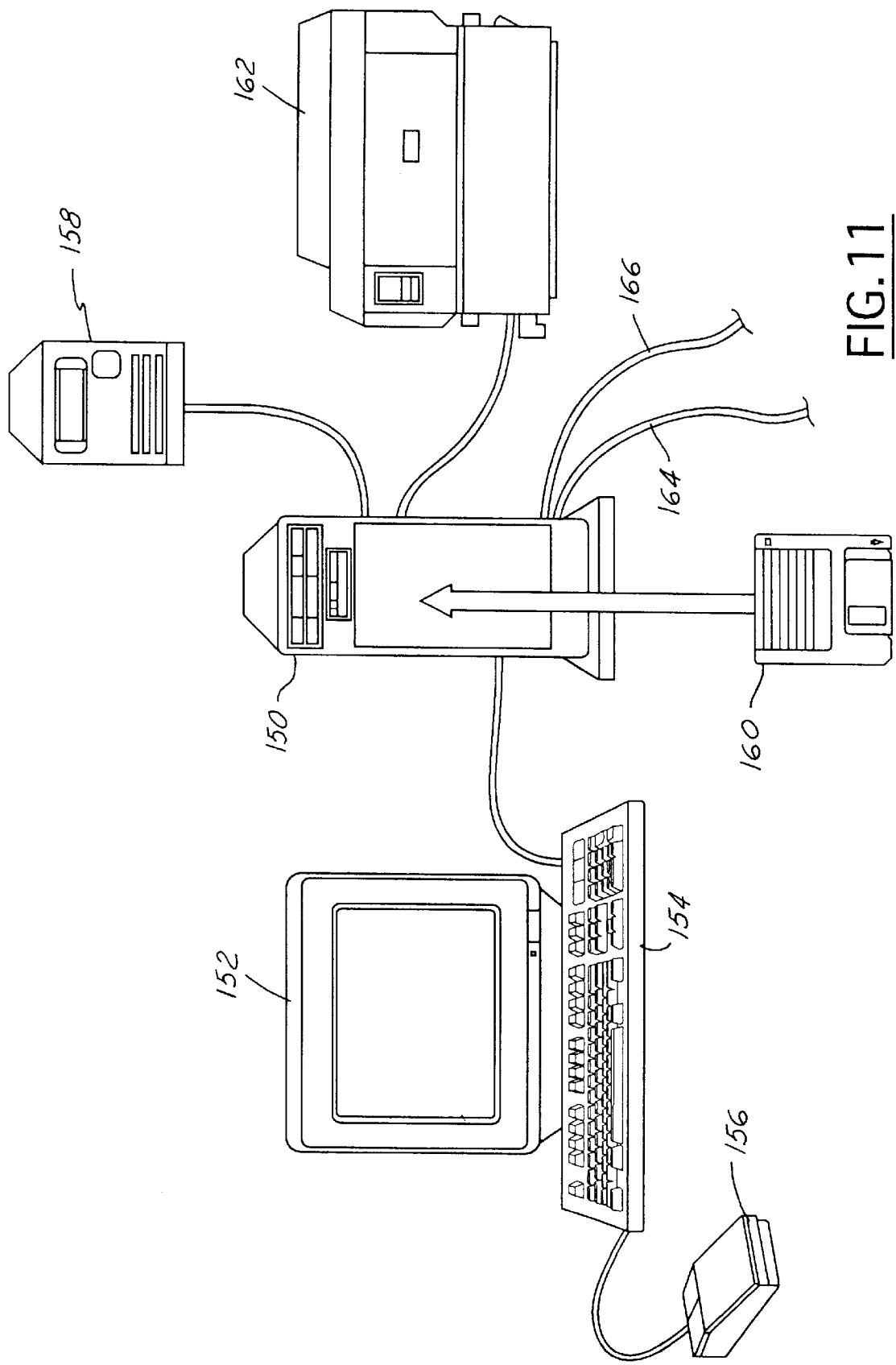
FIG. 11 is a view of a system for designing a portion of an automotive vehicle according to the present invention.

A representative system for occupant based vehicle design according to the present invention is depicted in FIG. 11. The system includes a processing unit 150 connected to a user interface which may include a display terminal 152, a keyboard 154, a pointing device, such as a mouse, 156, and the like. The processing unit 150 preferably includes a central processing unit, a memory, and stored instructions which implement a method for vehicle design according to the present invention. The stored instructions may be stored within the processing unit 150 in the memory, or in any non-volatile storage such as magnetic or optical media, EPROM, EEPROM, or the like. Alternatively, instructions may be loaded from removal magnetic media 160, such as a removal disk, sometimes called a floppy disk, optical media 158, or the like. In a preferred embodiment, the system includes a general to purpose computer program to implement the functions illustrated and described with reference to FIGS. 1–10. Of course, a system according to the present invention could also be embodied with a dedicated device which includes various combinations of hardware and software. The preferred embodiment may also include a printer 162 connected to the processing unit 150, as well as a network connection for accessing a local server, an intranet 164, and the Internet 166. Preferably, solid modeling software, parametric design software, surface rendering software, animation software, and the like are used for developing a system according to the present invention.

Figure 12:
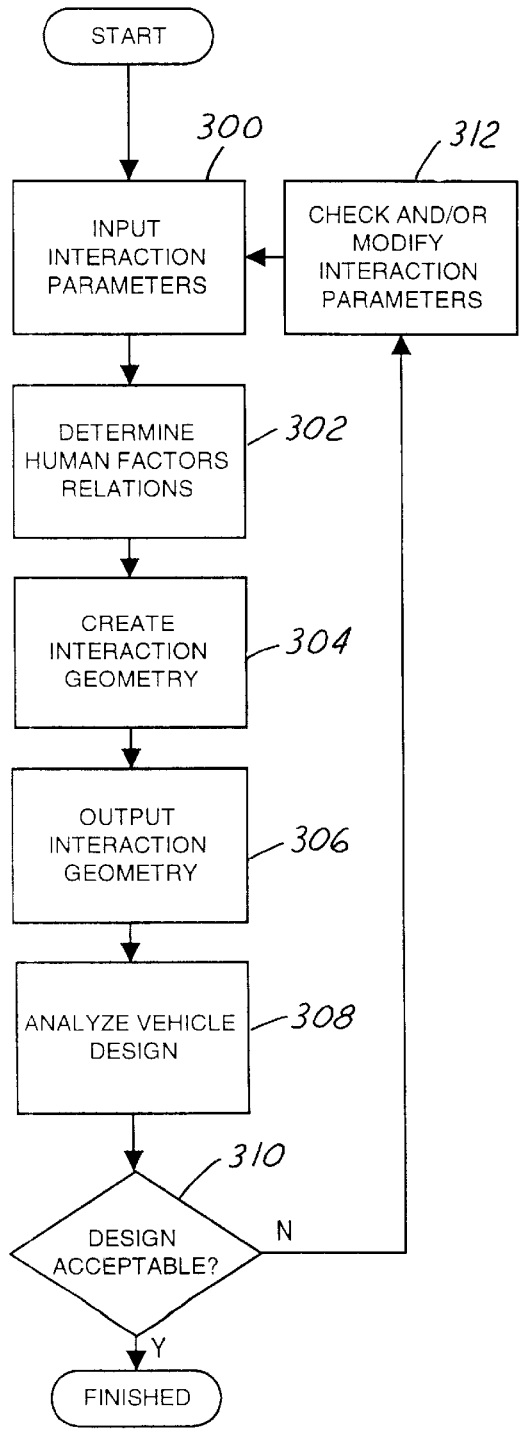
FIG. 12 is a flowchart showing a method for vehicle design using occupant interaction surfaces according to the present invention.

A method for vehicle design using occupant interaction surfaces according to the present invention is shown in FIG. 12. Beginning in box 300, various interaction parameters are input into the system. Preferably, a set of default input interaction parameters are available which can be modified by a vehicle designer to meet design specifications. These input interaction parameters may include, for example, an occupant hip point (H point), a heel point, which may be located by a vertical distance (H30) from the H point and a horizontal distance (L53) from the H point, a foot angle on the accelerator (L47, angle Theta), the steering wheel outer diameter (W9), the steering wheel angle from the vertical (H18), a back angle (L40), steering wheel geometry, a center location for the steering wheel, a planview rotation angle for the steering wheel, a horizontal distance from the heel point to the center of the steering wheel (L11), a distance from the heel point to the center of the steering wheel (H17), and an angle between the torso of an occupant and the upper leg of the occupant (L42). Those skilled in the art will recognize that some of the input interaction parameters may be SAE parameters. Other input parameters may also be defined to further refine the occupant interaction studies of the present invention.

In box 302 of FIG. 12, various human factors relations are determined after the input interaction parameters have been identified. An occupant-to-vehicle interaction geometric representation is created in box 304 and is outputi tion surface geometry is electronically oriented within the vehicle. In box 308, the vehicle design is analyzed with respect to the interaction surface. In the decision diamond 310, if the design is acceptable, then the process for the particular interaction study is finished. However, if the design is not acceptable, then the flow branches from the decision diamond 310 to the box 312 in which the input interaction parameters are checked to determine if they are satisfactory, and/or the input parameters are modified. The flow then returns to box 300 in which the modified parameters are input to the method and system of the present invention, and the process flow continues as just described.

Figure 13:
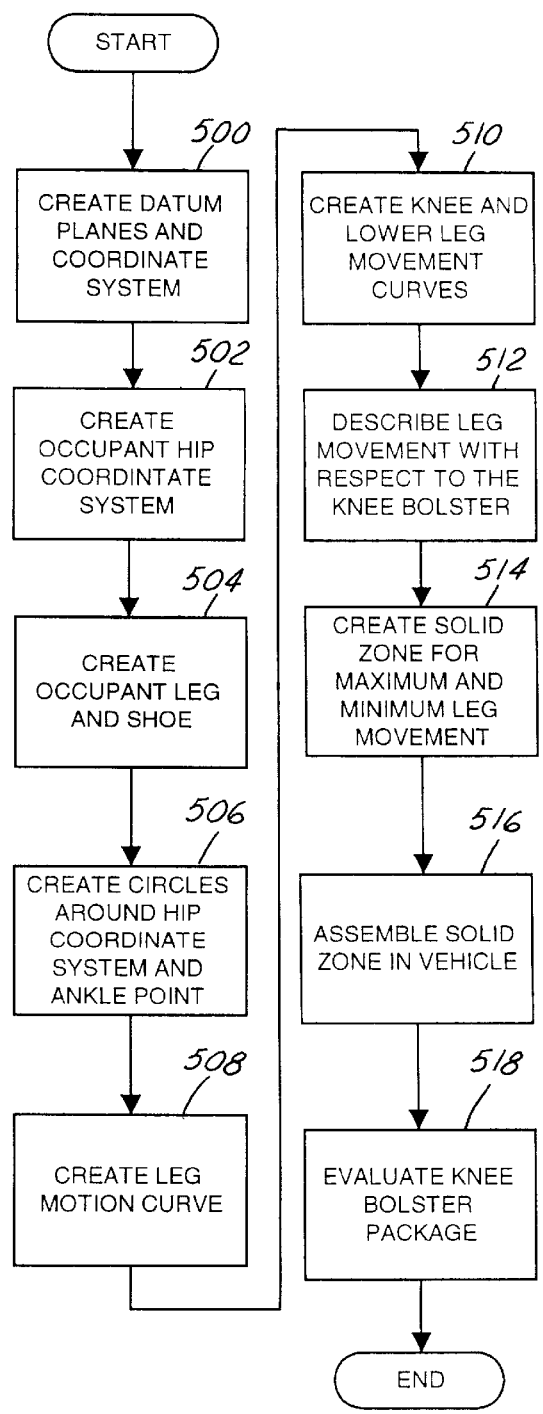
FIG. 13 is a flowchart showing creation of a knee bolster volume for use in a human factors interaction study according to an embodiment of the present invention.
Figure 14:
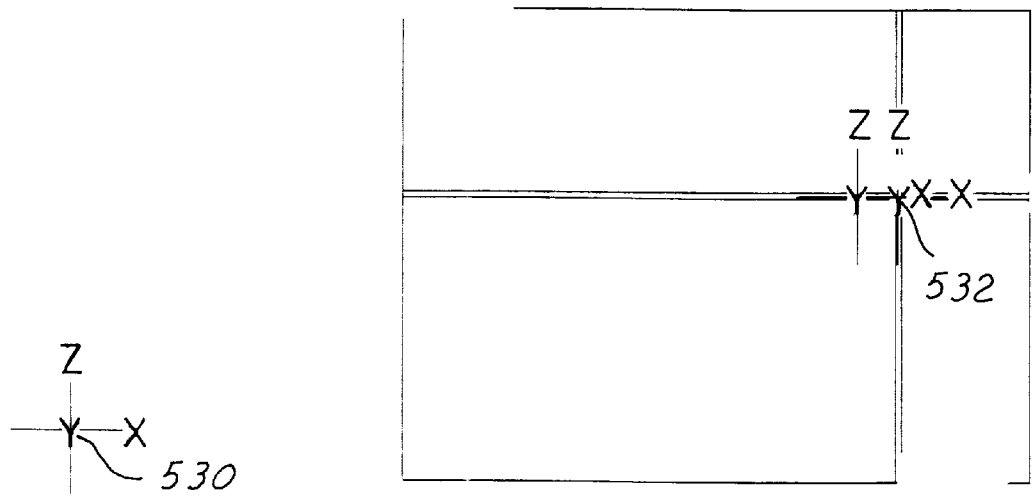
FIG. 14 is a view of a preselected vehicle coordinate system and an occupant coordinate system located at a predetermined hip point fixed relative the vehicle coordinate system.

An example of an occupant-to-vehicle study of the present invention is shown in FIG. 13, in particular, being a knee-bolster study. Beginning in box 500, a coordinate system (530 in FIG. 14) is constructed in accordance with the vehicle coordinate system described above. The coordinate system 530 is three-dimensional having an x-axis oriented in a fore-aft direction of the vehicle, a y-axis oriented in a transverse direction of the vehicle, and a z-axis oriented vertically with respect to the vehicle. From the coordinate system 530, datum planes may be created for constructing knee-bolster study geometry as described below. In addition, a separate occupant hip coordinate system 532 (FIG. 14) may also be created (box 502, FIG. 13).

Figure 15:
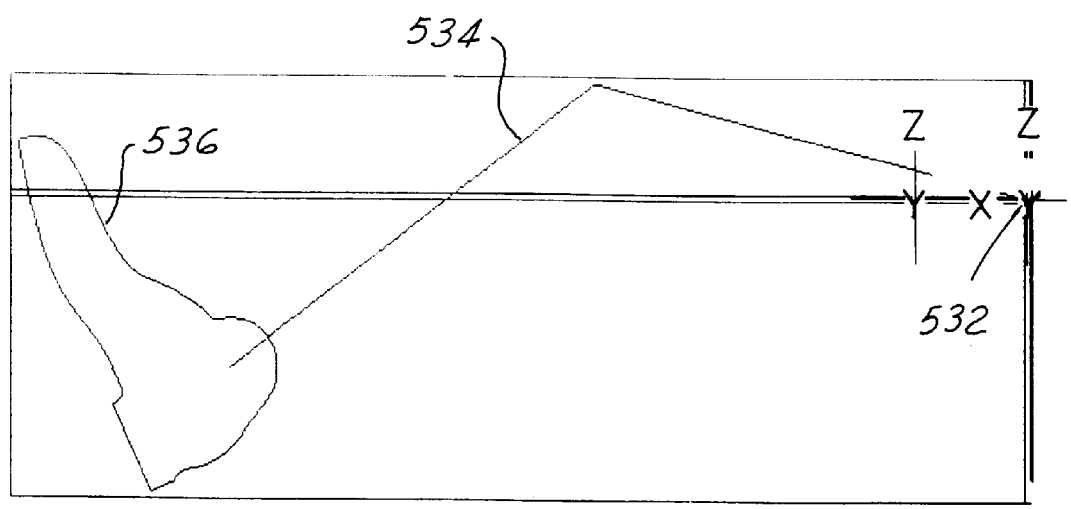
FIG. 15 is a view of an occupant leg and shoe representation in the selected occupant coordinate system.
Figure 16:
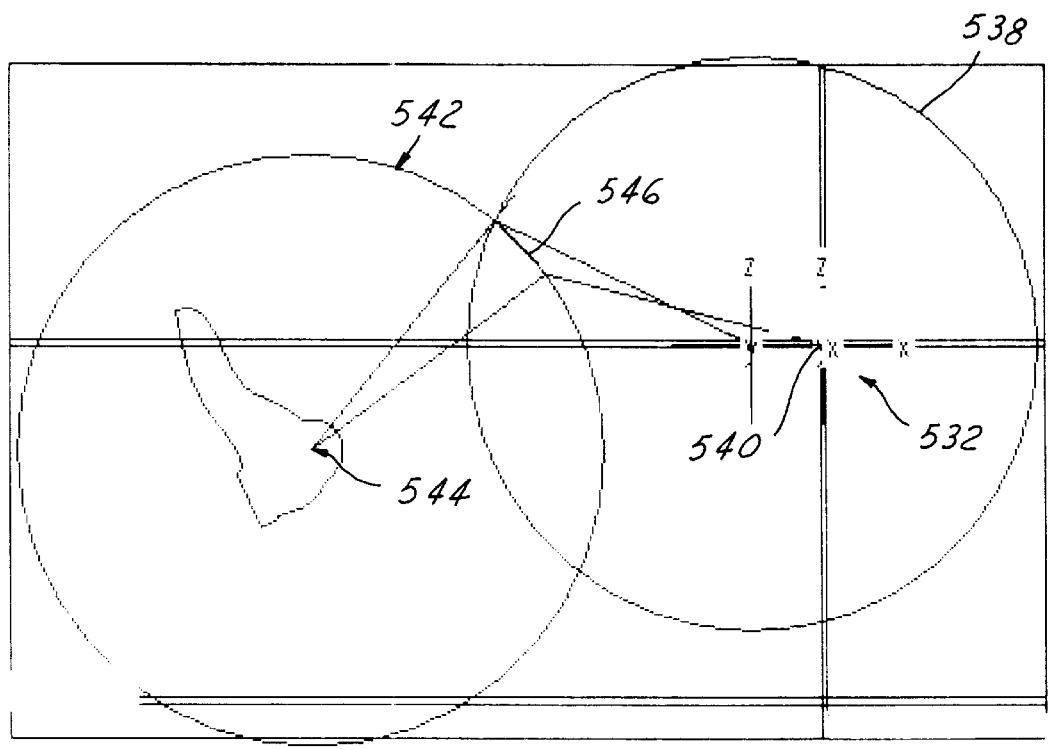
FIG. 16 is a coordinate system view of a pair of leg curves describing occupant knee and lower leg movement in the occupant coordinate system.
Figure 17:
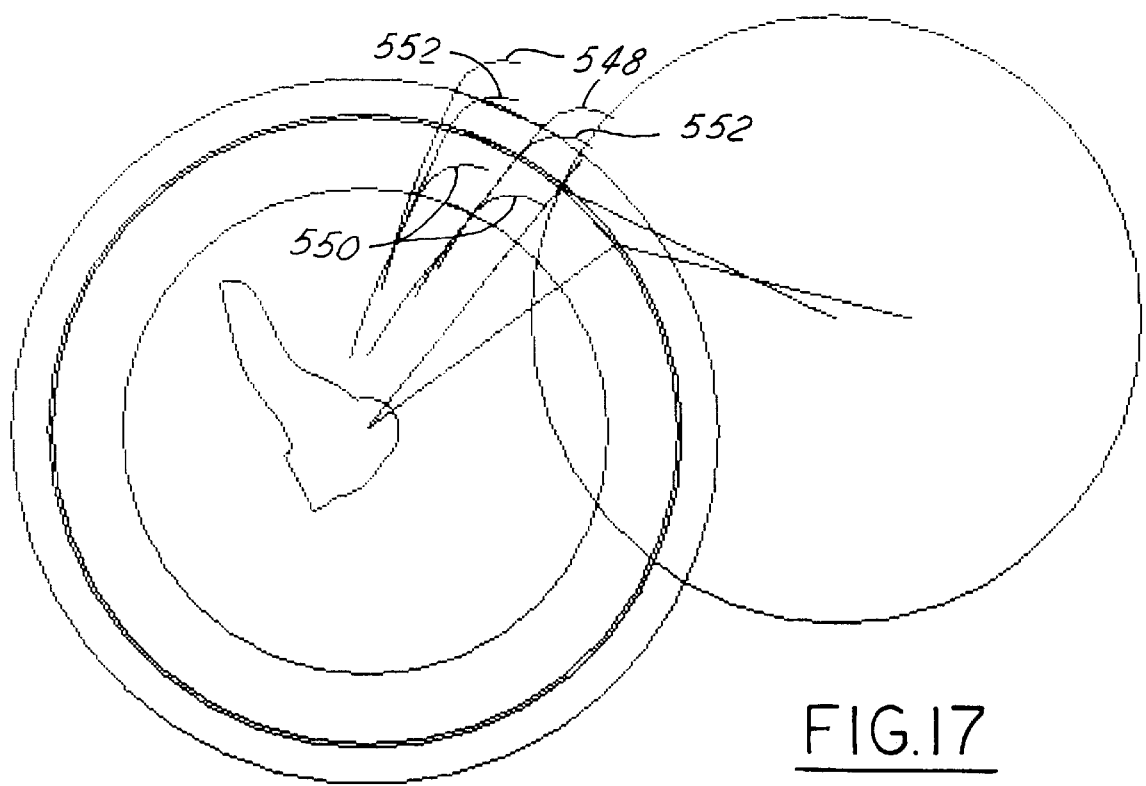
FIG. 17 is a view showing occupant knee and lower leg position along the leg curves.
Figure 18:
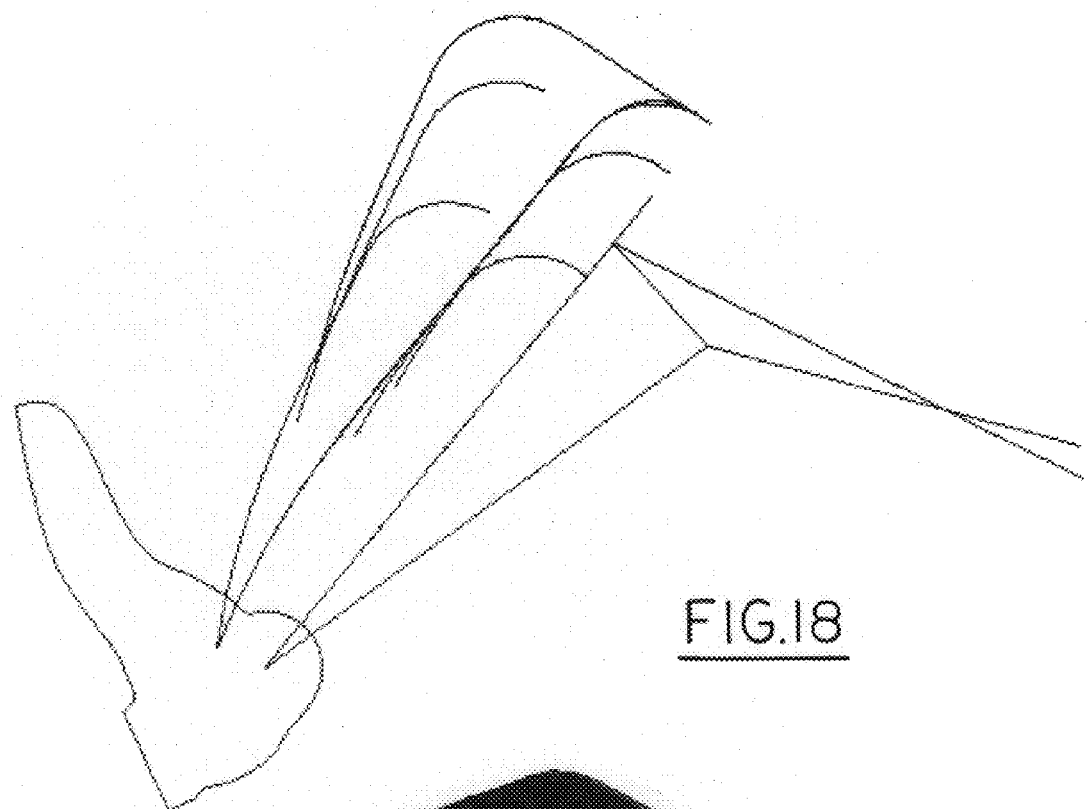
FIG. 18 is a side view showing creation of a knee bolster solid representing occupant lower leg movement in the reference system.
Figure 19:
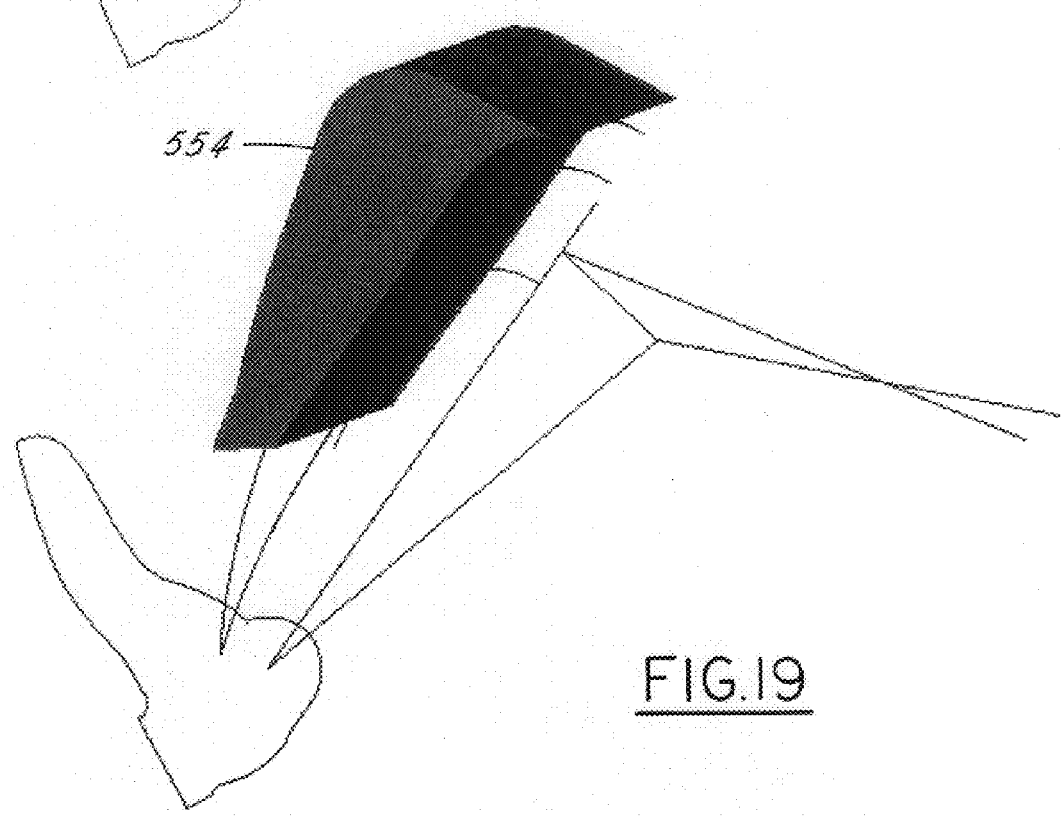
FIG. 19 is a three-dimensional view of the knee bolster of FIG. 18.
Figure 20:
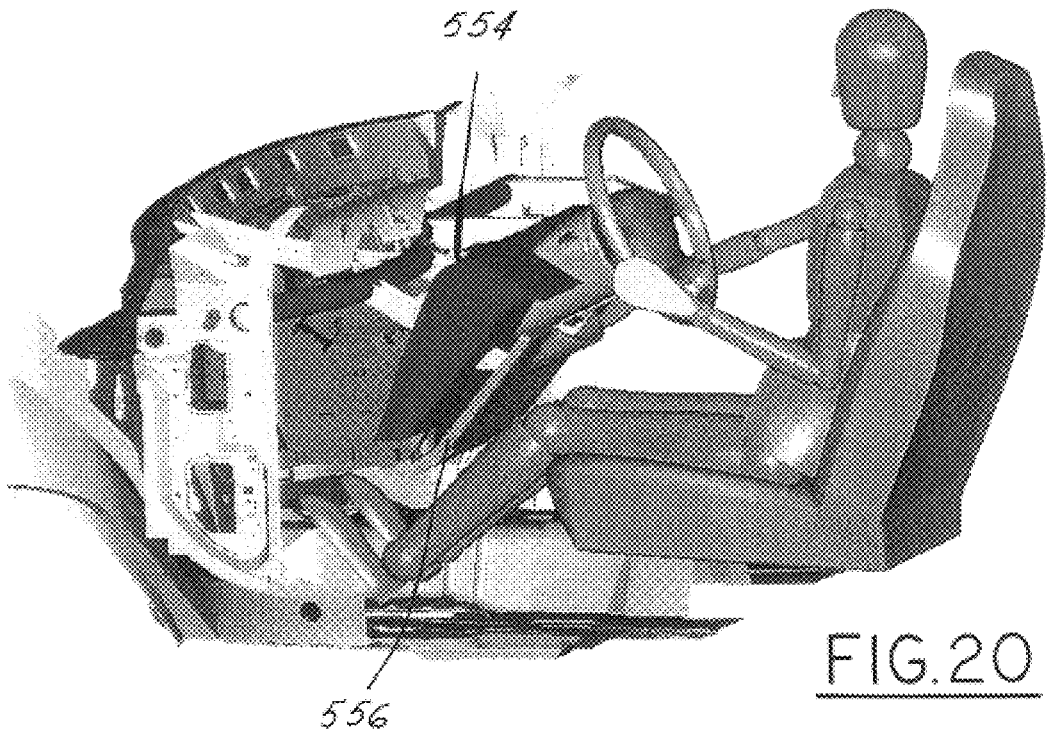
FIG. 20 is a color perspective view of the occupant knee bolster solid when located in a vehicle indicating interference of occupant leg movement with a vehicle knee bolster.
Figure 21:
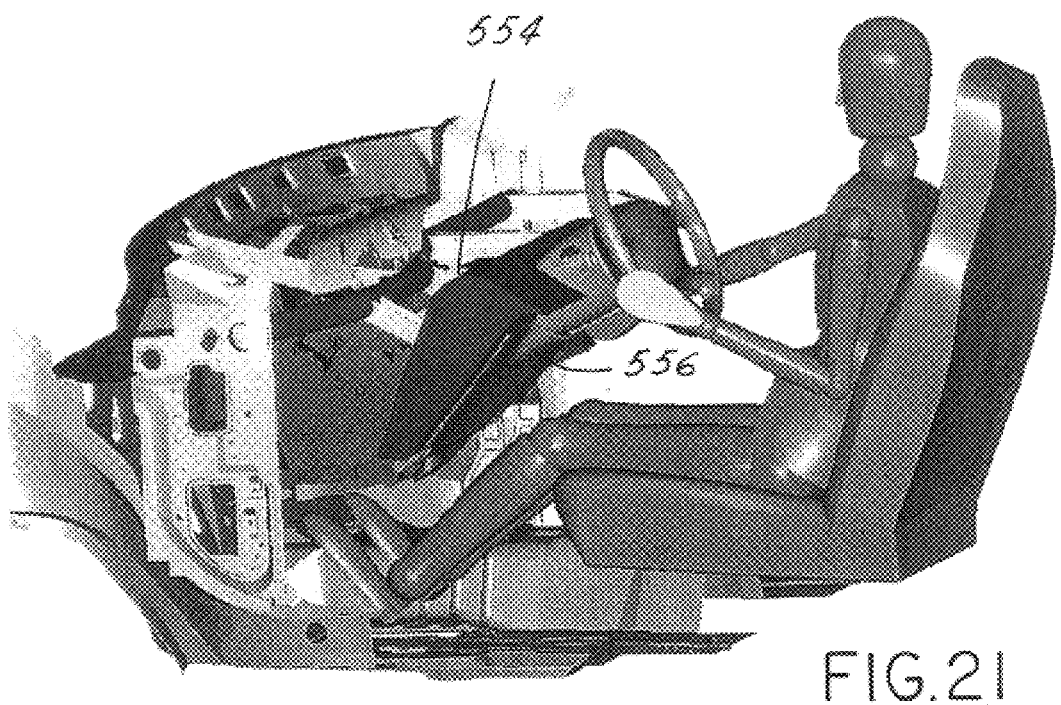
FIG. 21 is a color perspective view similar to FIG. 20 but showing a modified vehicle knee bolster location so that occupant leg movement meets a predefined vehicle interaction criteria.

In box 504 of FIG. 13, a representation of an occupant leg 534 and an occupant foot and shoe 536 are oriented with respect to the hip coordinate system 532 (FIG. 15). Next, in box 506 of FIG. 13, a circle 538 is created around the hip point 540, and a circle 542 is created around an ankle point 544 (FIG. 16). An occupant leg range of motion curve 546 is then created (box 508 of FIG. 13), for example, by moving the hip point 540 in a pre-defined range along the x-axis of the hip point coordinate system 532 (FIG. 16). In box 510 of FIG. 13, the just described process of boxes 504, 506 and 508 is used to create knee and lower leg movement curves to define leg location of various sized occupants, including a $95^{th}$ percentile occupant curve 548, a $5^{th}$ percentile occupant curve 550, and a $50^{th}$ percentile expected occupant curve 552. These curves, which represent the expected range of leg motion for most vehicle occupants in the vertical and longitudinal directions (FIG. 18), are created in box 512 FIG. 13). A solid volume 554 (FIG. 19) is created in box 514 (FIG. 13) by extending the leg movement profile of FIG. 18 along the y-axis a predetermined distance, for example, the width of the seat. After the solid volume 554 has been created, it is assembled into the vehicle representation (FIG. 20), as indicated in box 516 of FIG. 13. Vehicle design is then evaluated with respect to interaction between the leg movement solid volume 554 and a knee bolster 556, which was previously packaged onto the vehicle, for example, at box 66 of the process previously described in FIG. 5. As seen in FIG. 20, the knee bolster surface 556 is rearward of a preferred bolster location adjacent the solid volume 554. A vehicle designer may desire to remedy the situation using the design change procedure of FIG. 10 in order to meet the knee bolster criteria, since ingress and egress may be adversely affected in the design of FIG. 20. In order to improve the situation, the knee bolster 556 can be moved in a forward direction adjacent the solid volume 554, as seen in FIG. 21.

Figure 22:
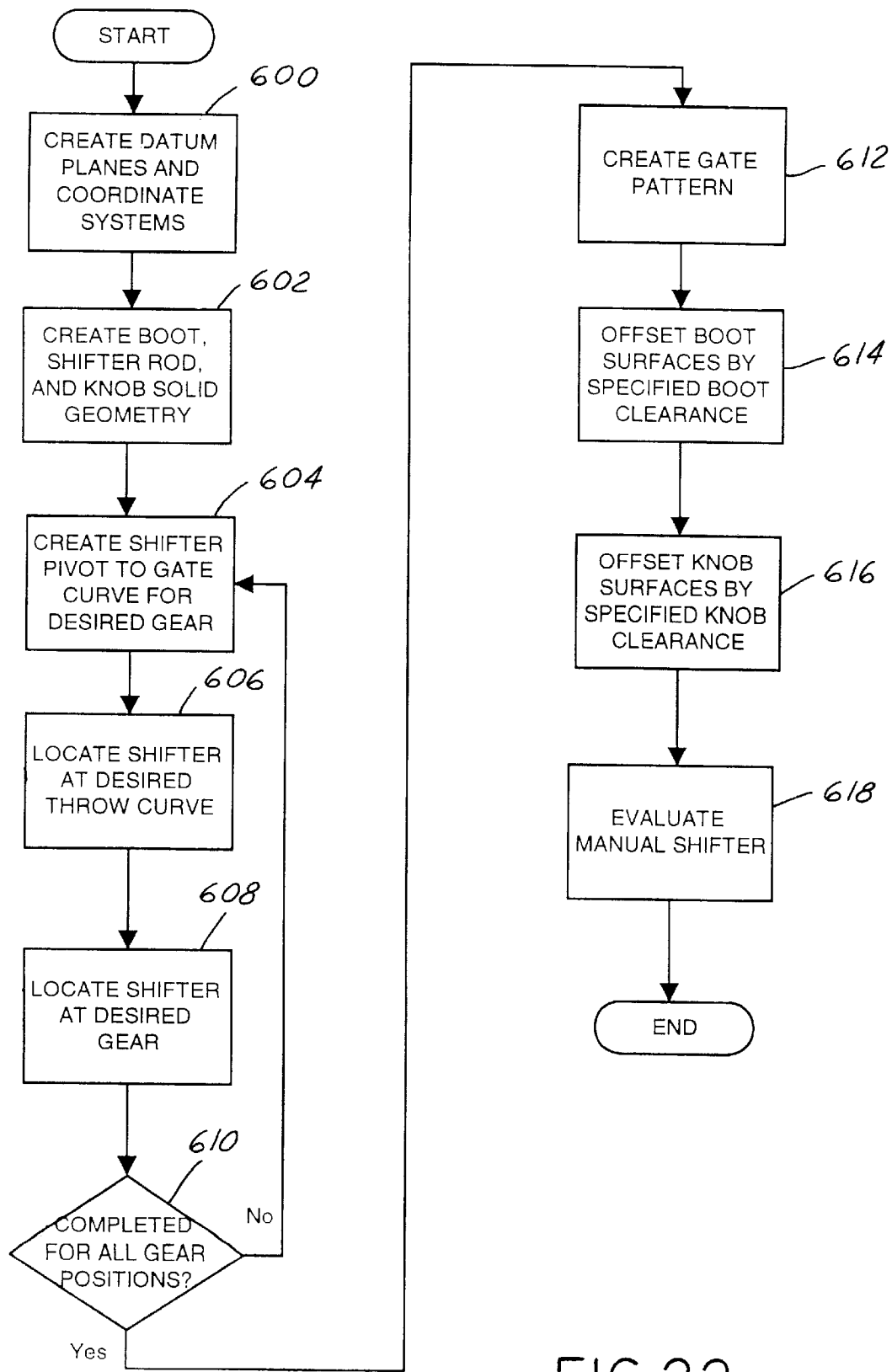
FIG. 22 is a flowchart showing creation of a manual shifter hand clearance volume for use in a human factors interaction study according to an embodiment of the present invention.
Figure 23:
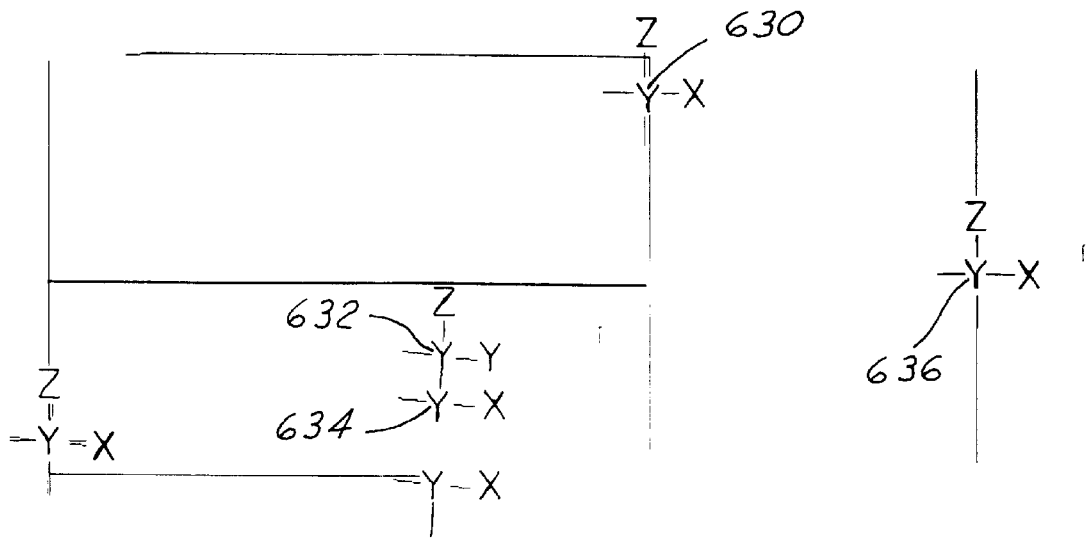
FIG. 23 is a view of a preselected vehicle coordinate system and an manual shifter coordinate system fixed relative the preselected vehicle coordinate system.
Figure 24:
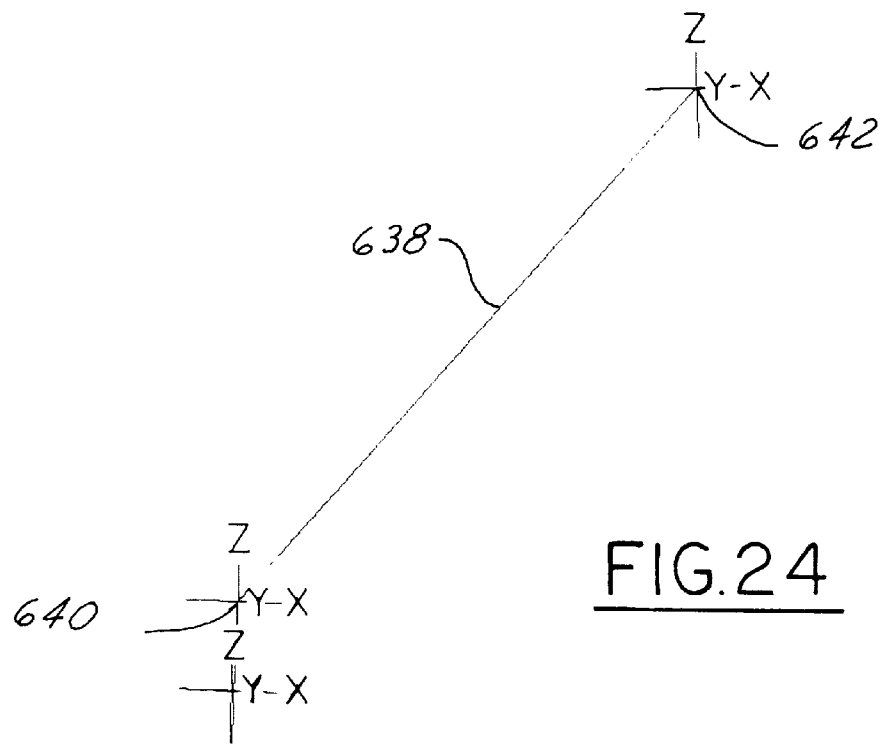
FIG. 24 is a view of a manual shifter representation in the manual shifter coordinate system.
Figure 25:
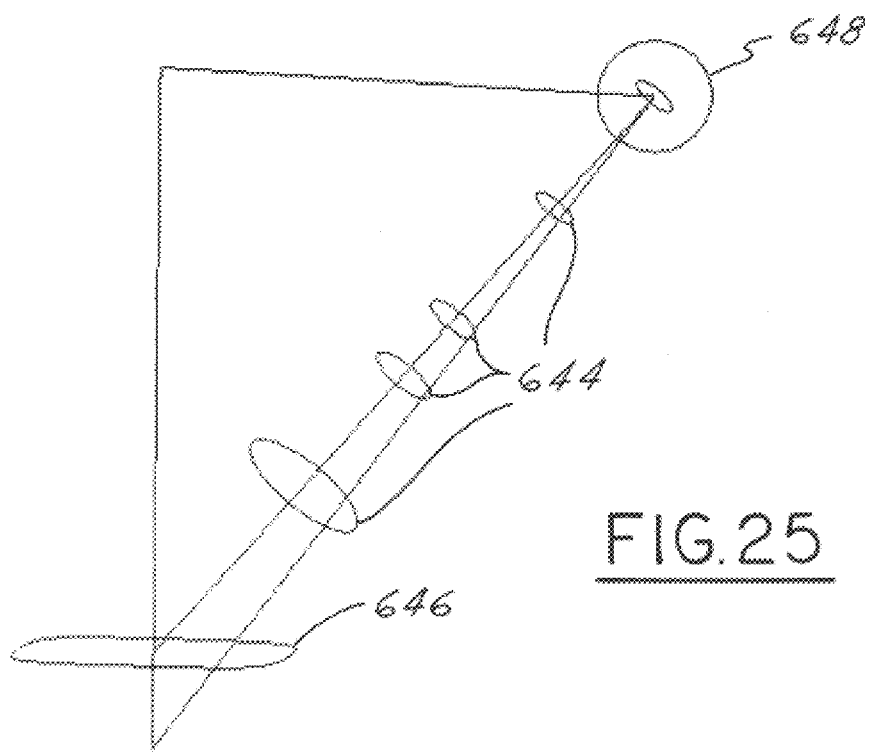
FIG. 25 is a coordinate system view showing curves used in creation of a solid representation of a manual shifter.
Figure 26:
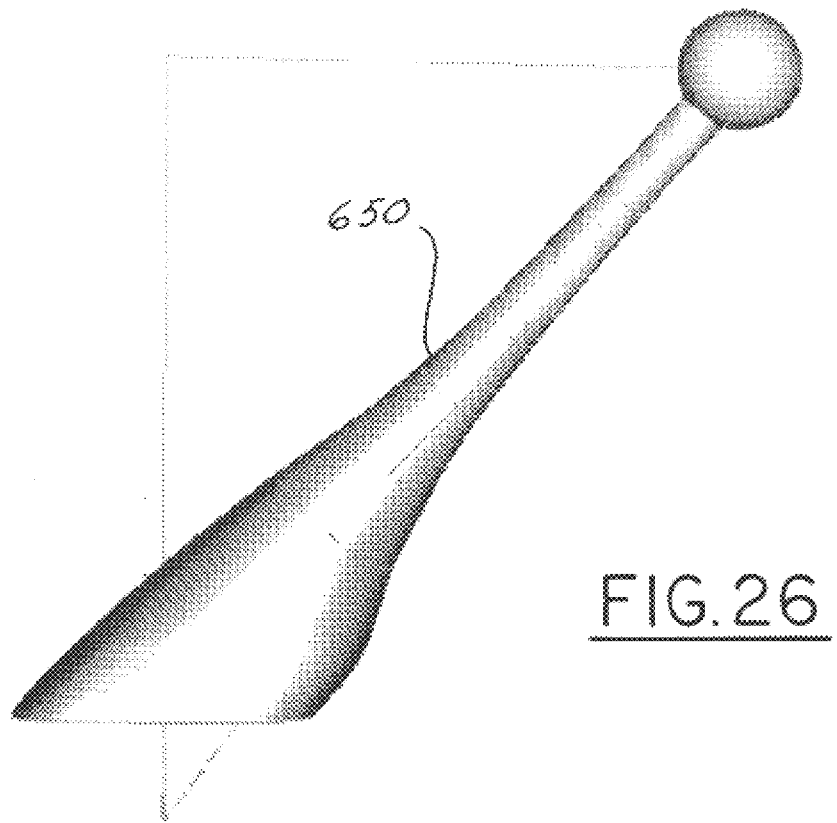
FIG. 26 is a perspective view of a manual shifter solid used in creating a hand clearance envelope.
Figure 27:
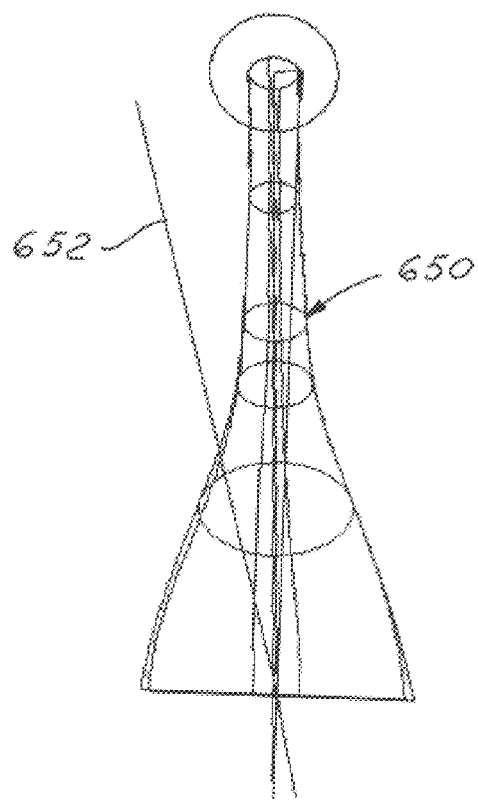
FIG. 27 is a coordinate system view showing movement of the manual shifter from a nuetral gear position to a selected gear position.
Figure 28:
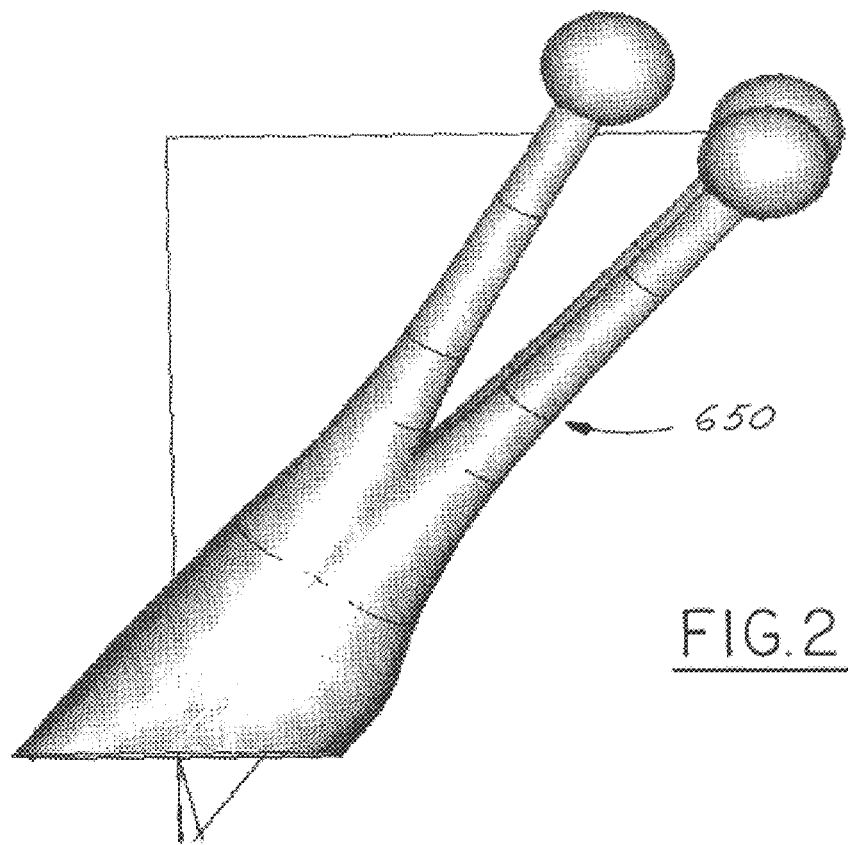
FIG. 28 is a perspective view of the manual shifter in the nuetral position and in two other gear positions.
Figure 29:
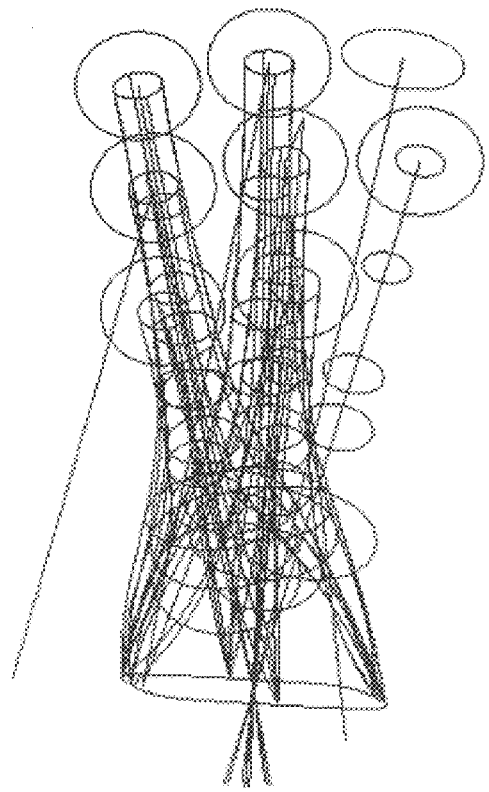
FIG. 29 is a coordinate system view showing the manual shifter in a complete range of gear positions.
Figure 30:
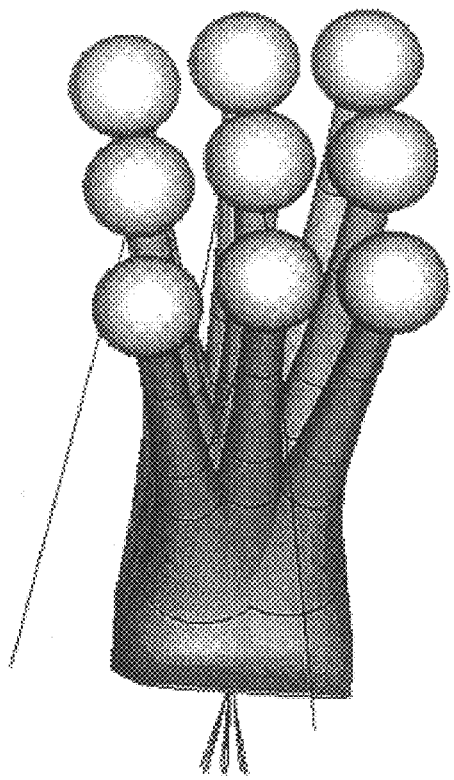
FIG. 30 is a perspective view of a rendered solid of the manual shifter of FIG. 29.
Figure 31:
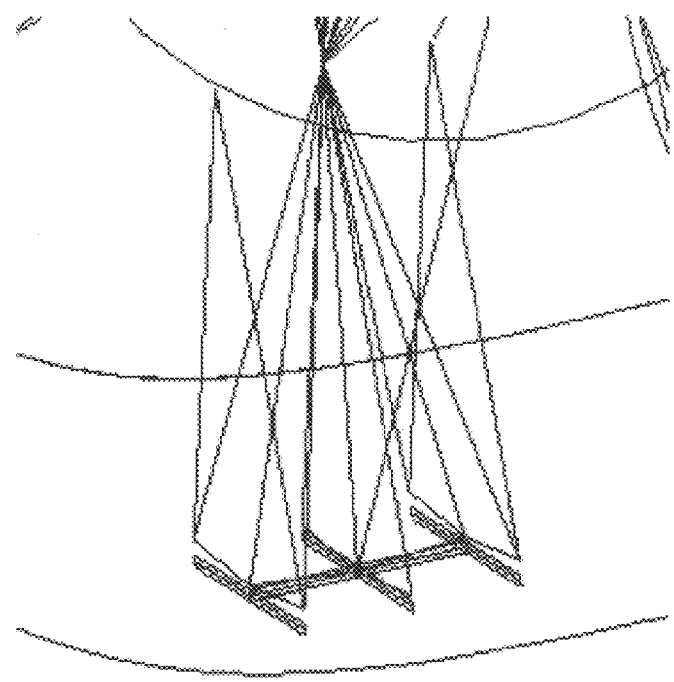
FIG. 31 is a coordinate system view showing the manual shifter gate positions corresponding to the gear positions of FIGS. 29 and 30.
Figure 32:
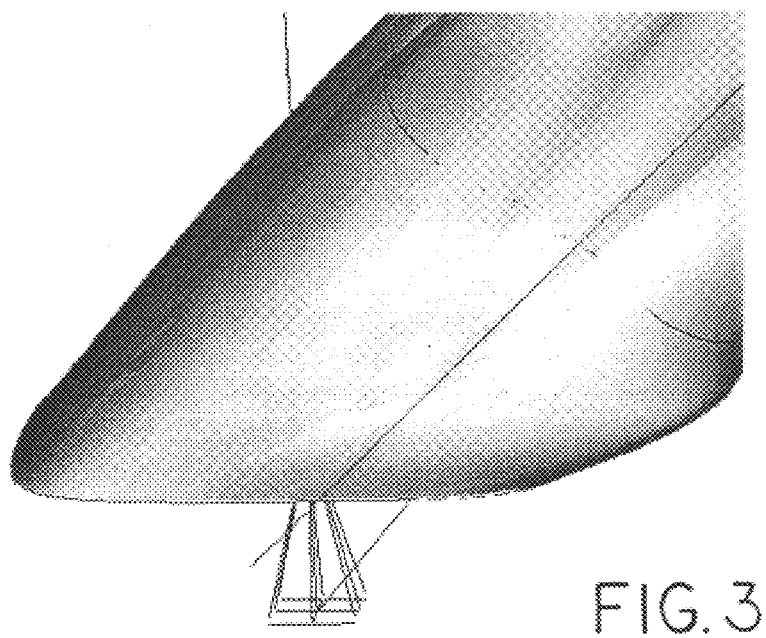
FIG. 32 is a perspective view of a rendered solid of a manual shifter boot.
Figure 33:
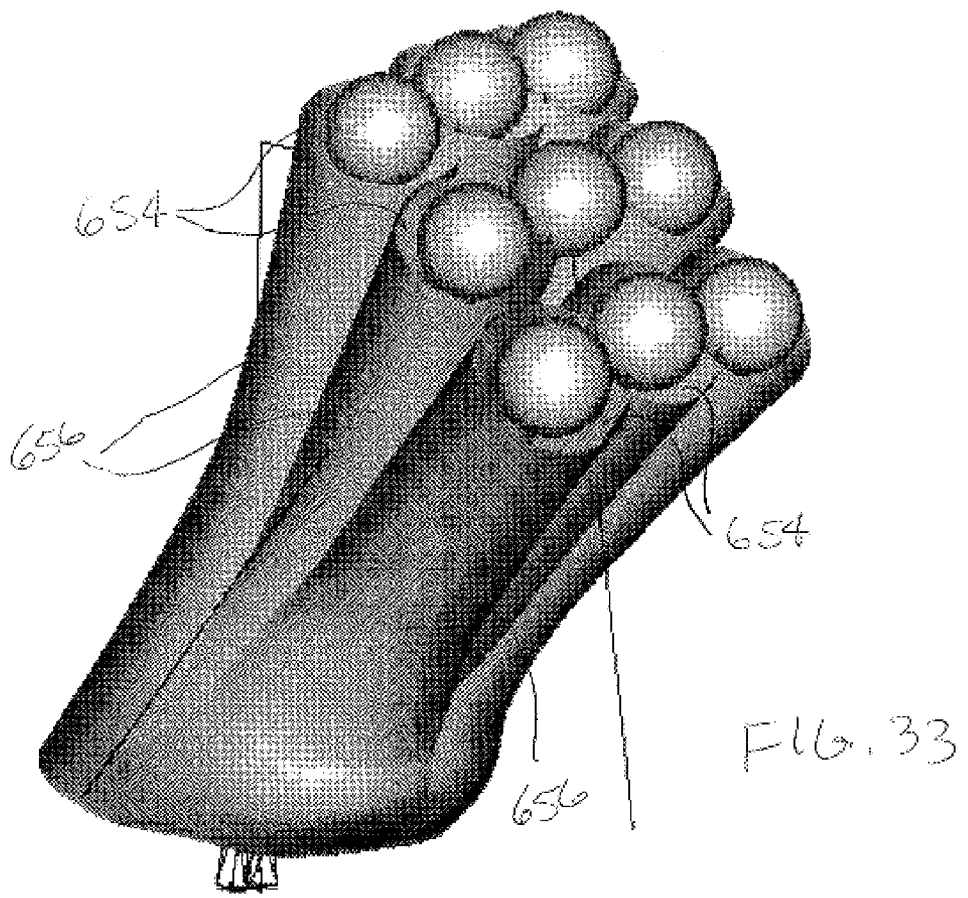
FIG. 33 is a perspective view the manual shifter of FIG. 30 with a predetermined boot clearance envelope rendered at each gear position.
Figure 34:
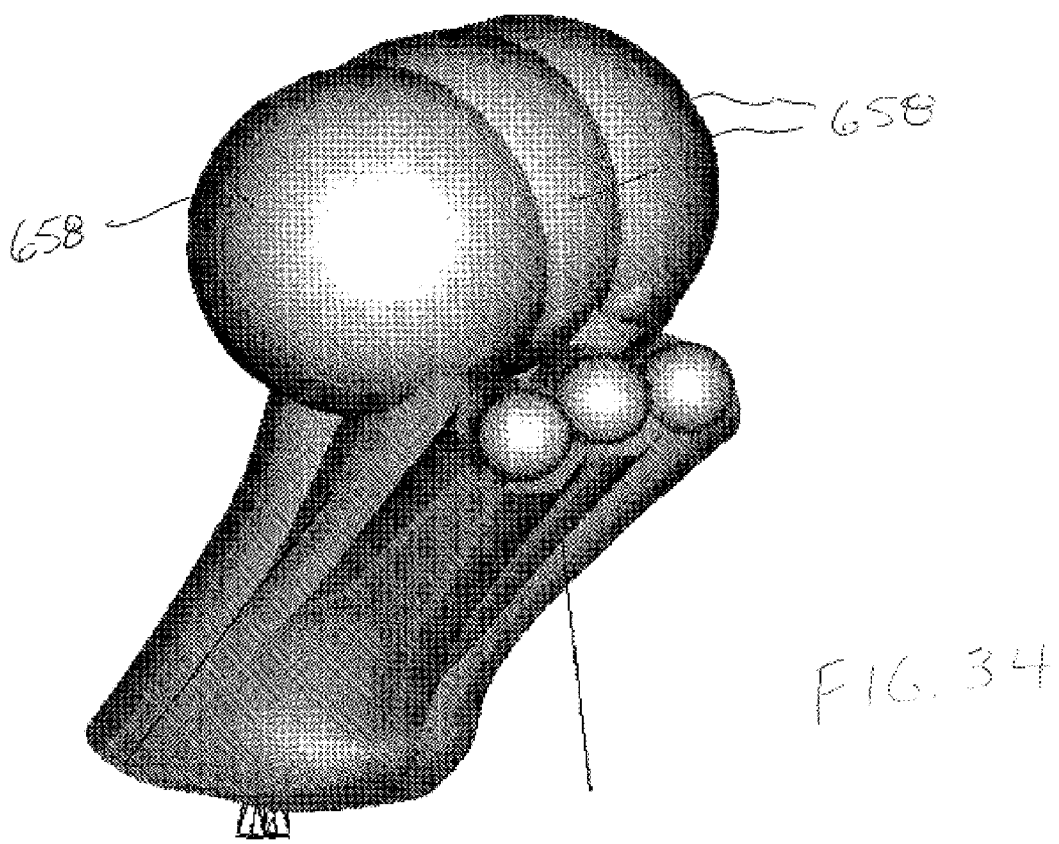
FIG. 34 is a perspective view the manual shifter of FIG. 33 with a predetermined knob clearance envelope rendered a three of the shifter gear positions.
Figure 35:
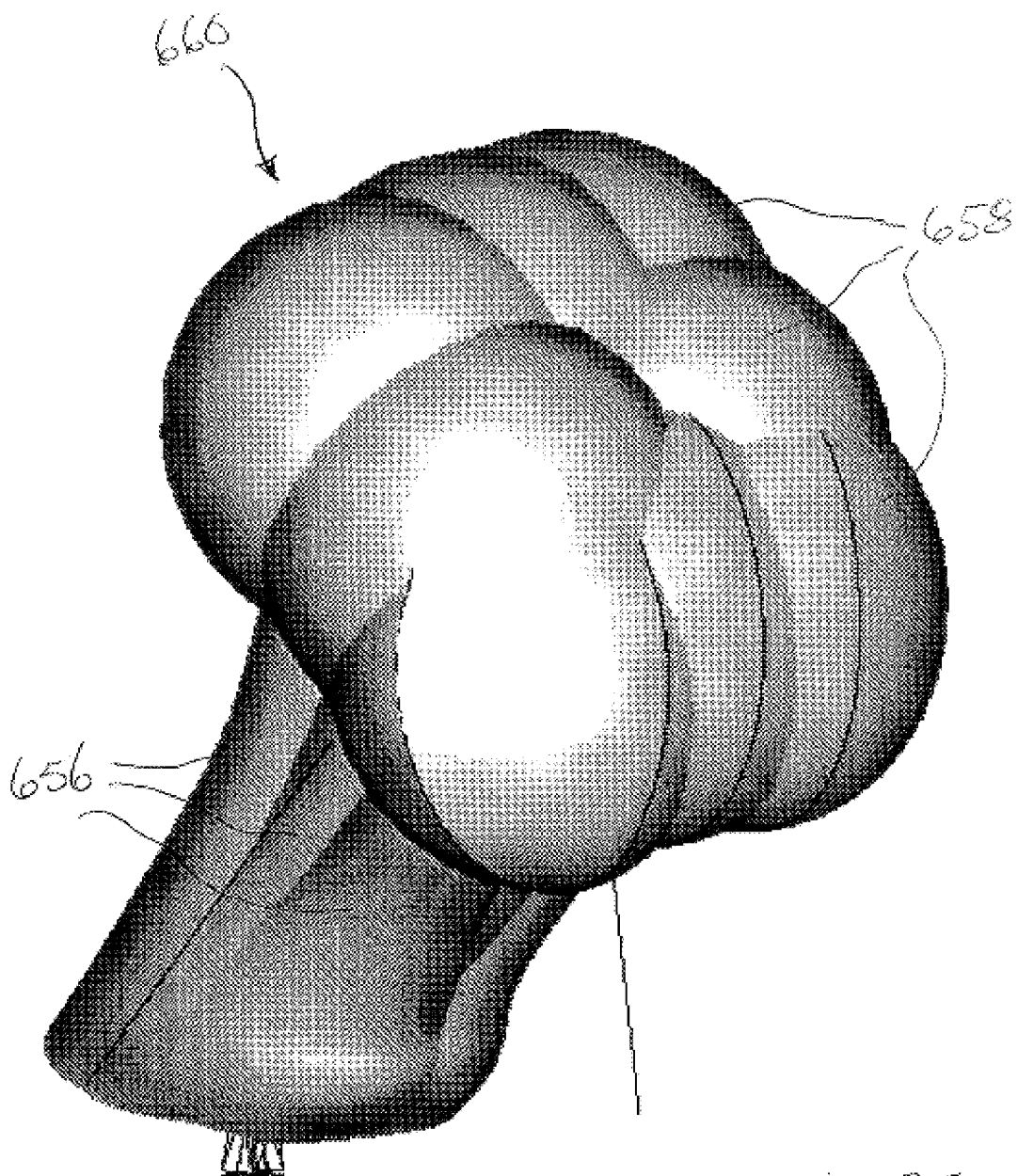
FIG. 35 is a perspective view the manual shifter of FIG. 34 showing a composite manual shifter hand clearance envelope for use in an occupant interaction study of the present invention.
Figure 36:
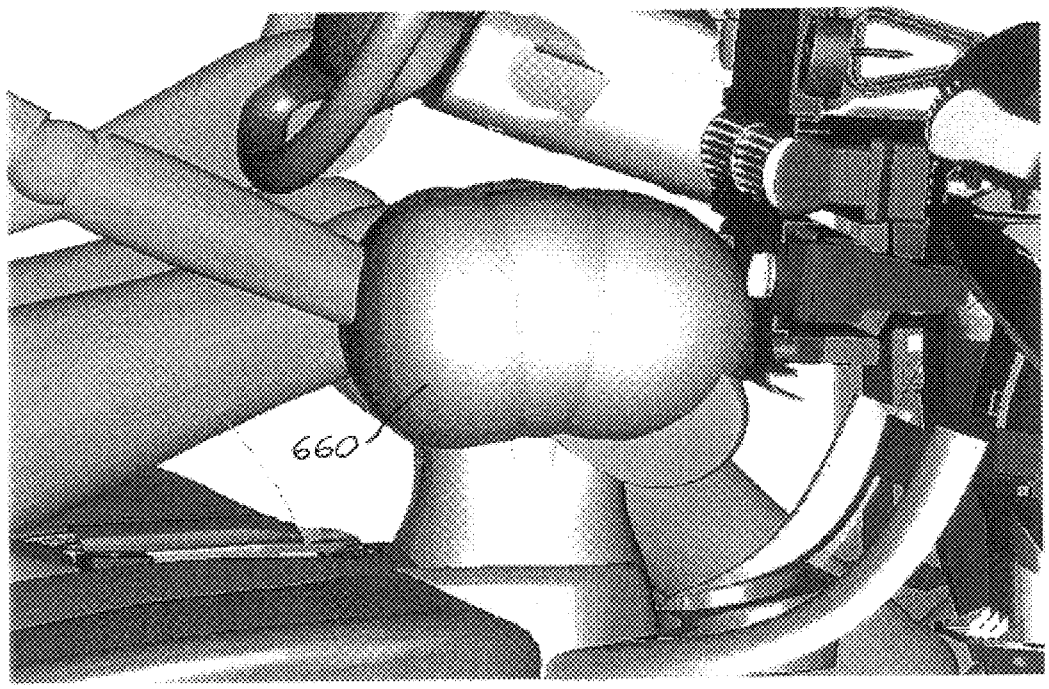
FIG. 36 is a color perspective view of the manual shifter hand clearance envelope of FIG. 35 when located in a vehicle indicating interference of an occupant hand with a vehicle system when shifting the manual shifter.
Figure 37:
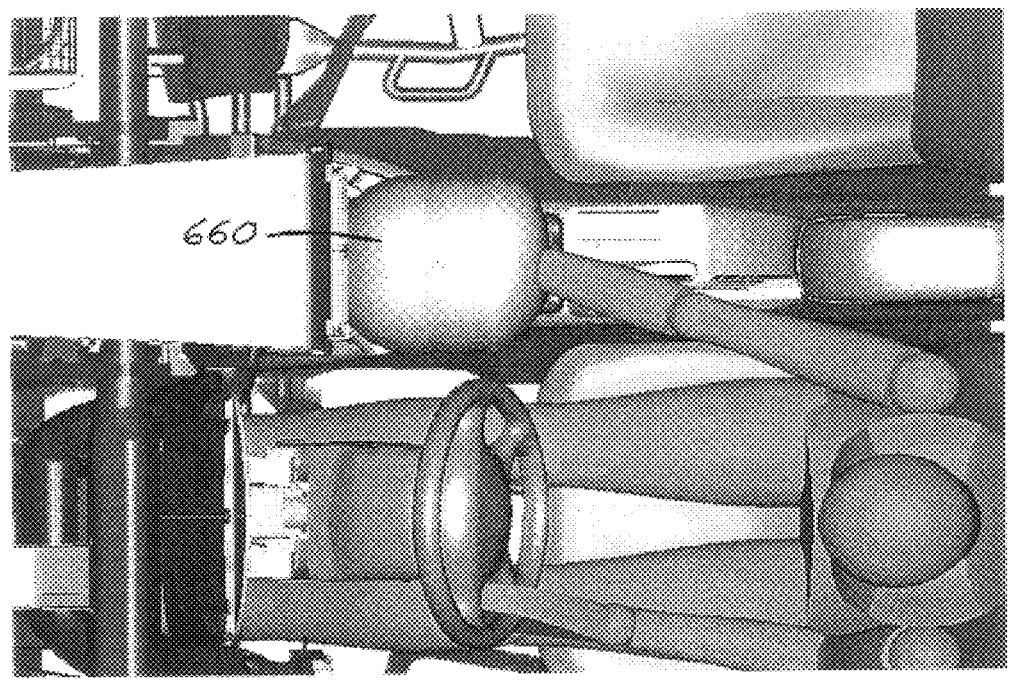
FIG. 37 is a top view of FIG. 36.
Figure 38:
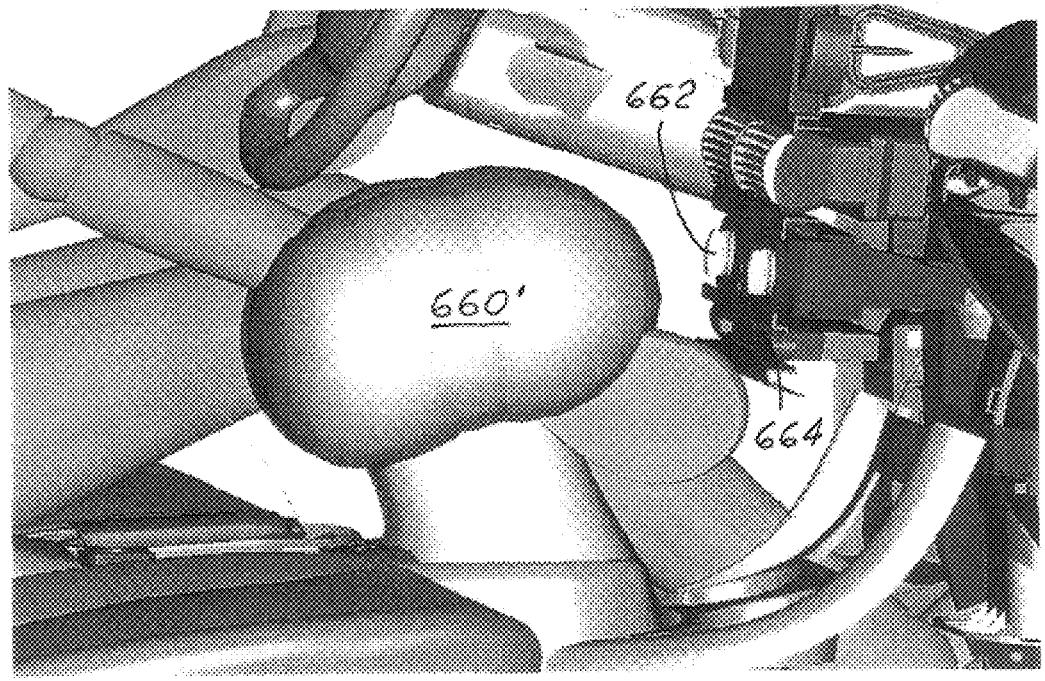
FIG. 38 is a color perspective view similar to FIG. 36 but showing a modified manual shifter location so that occupant hand movement does not interfere with vehicle center stack components to meet a predefined vehicle interaction criteria.
Figure 39:
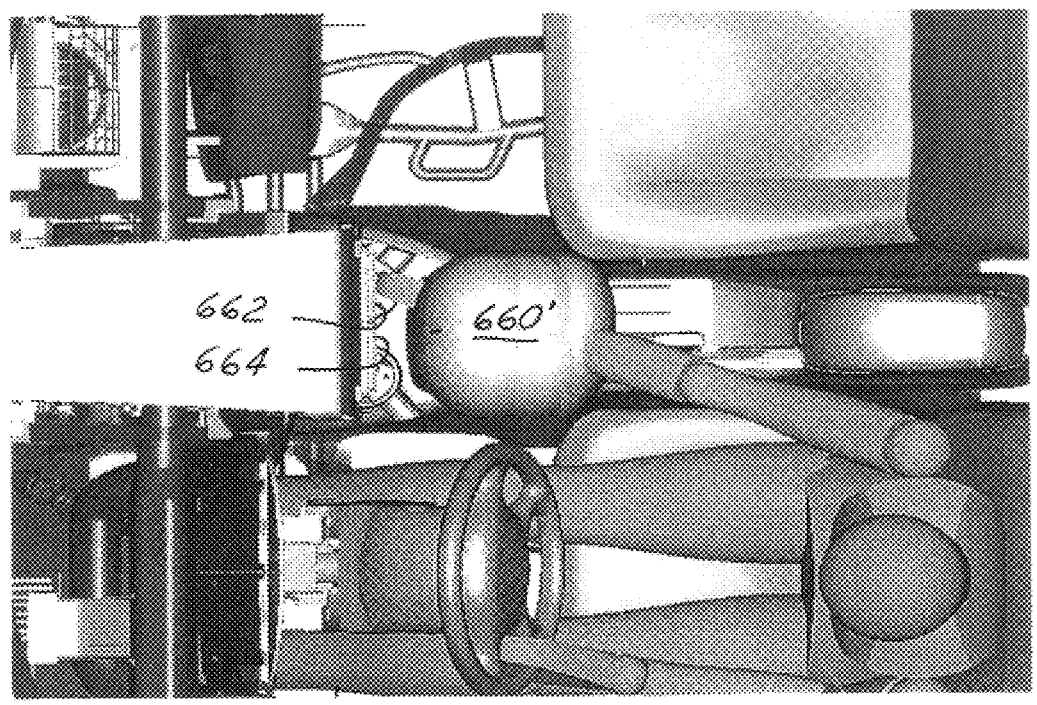
FIG. 39 is a top view of FIG. 38.

Turning now to FIG. 22, a process for evaluating a manual shifter with respect to interaction with nearby vehicle systems is shown. In box 600, datum planes and coordinate systems are constructed, including coordinate systems for a neutral shifter gear location (630, FIG. 23), a shifter pivot location (632, FIG. 23), and a shifter gate location (634, FIG. 23). These coordinate systems can be referenced to another coordinate system, such as a hip point coordinate system 636 (FIG. 23), or can be independently located with respect to the vehicle body coordinate system described above. In box 602 (FIG. 22), a curve, for example, a line 638 (FIG. 24), is created by extending a line between the pivot point 640, which is at the origin at the pivot axis 632, and the neutral shift position 642, which is at the origin of the neutral shift axis 630, to represent a neutral gear shifter position. Gear shifter cross-sections 644 and a gear shifter boot cross-section 646 are created, as is a shifter knob cross-section 648 FIG. 25). From these cross-sections, a solid representation of a manual shifter 650 in the neutral gear position can be rendered (FIG. 26). Since an object of the manual shifter ergonomics study is to determine shifter interaction with adjacent vehicle systems, the shifter must be studied in all possible gear positions. Boxes 604. 606, 608, and decision diamond 610 illustrate the required steps. In box 604, a shifter pivot-to-gate curve for the desired gear is created (FIG. 27). Next, in box 606, a curve is created to locate a desired shifter throw distance, which is an input specified by a user to define a distance between a shifter location in the neutral location and a shifter location in a desired gear position. The throw distance can also be varied by changing the shifter gate pattern or the linkage length. The shifter 650 is then located at the desired gear location (box 608, FIG. 22) and rendered in a solid form (FIG. 28). At decision diamond 610 (FIG. 22), if all gear positions have not been rendered, process flow returns to box 604 where the next gear position is processed. After all gear positions have been processed, all the rendered solids are combined as shown in FIGS. 29 and 30. Process flow moves to box 612 where a gate pattern is created, as seen in FIG. 31. The gate pattern is important for determining transmission system design. In box 614, the boot surfaces are offset by a specified boot clearance 654 (FIG. 33), and boot offset surfaces 656 are rendered. In box 616, FIG. 22, knob surfaces are offset by a specified knob clearance, and the resulting expanded knob surfaces 658 are rendered (FIG. 34). The rendering of the boot clearance surfaces 656 and the knob clearance surfaces 658, when combined, result in a manual shifter clearance envelope 660 (FIG. 35). The shifter and clearance envelope 660 is then evaluated in box 618 (FIG. 22), for example, by locating it in a vehicle. Such a manual shifter envelope 660 is shown located in FIGS. 36 and 37. It can be seen that the envelope 660 interferes with center stack components, such as the HVAC controls 662 and the radio 664. Thus, in the vehicle design of FIGS. 36 and 37, the manual shifter, with a driver's hand thereon, may contact vehicle systems during the course of gear shifting. The situation can be remedied by relocating the manual shifter in a rearward direction, as seen in FIGS. 38 and 39. The manual shifter so located produces a modified manual shifter envelope 660', which does not interfere with center stack components, such as the HVAC controls 662 and the radio 664. Those skilled in the art will understand that the center stack components could also have been relocated, or both the manual shifter and the center stack components could be relocated to provide a design free of manual shifter interference with those components. It should also be understood that the specified knob clearance and the specified boot clearance are selected so as to represent a range of manual shifter designs, as well as a range of occupant hand dimensions.

Figure 40:
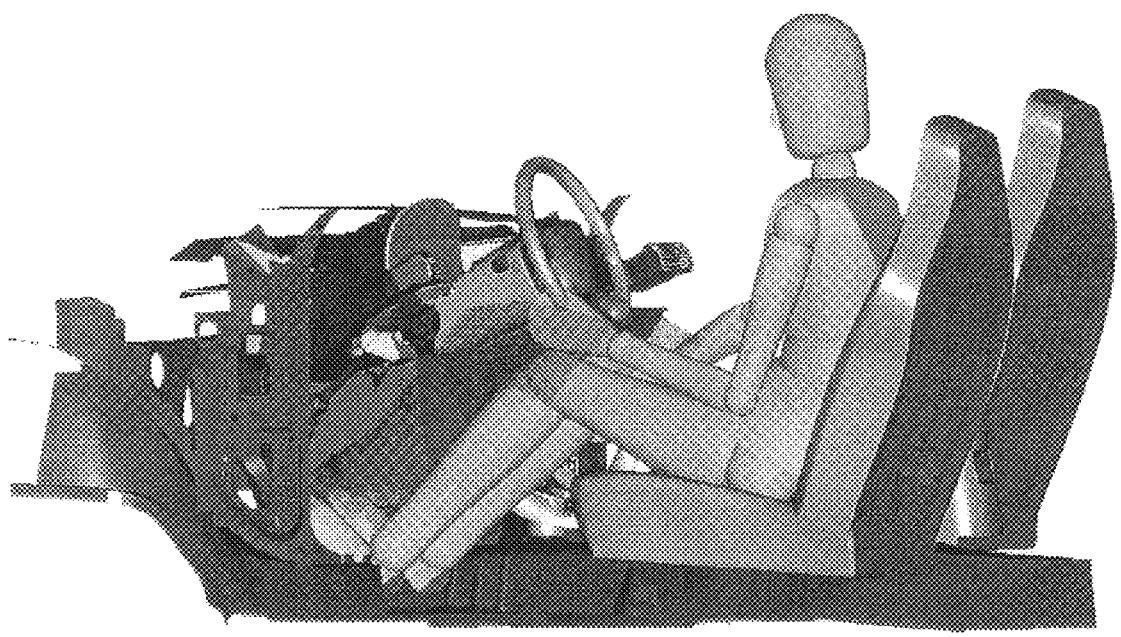
FIG. 40 is a color perspective view of an occupant representation in a vehicle showing a leg clearance study according the present invention.
Figure 41:
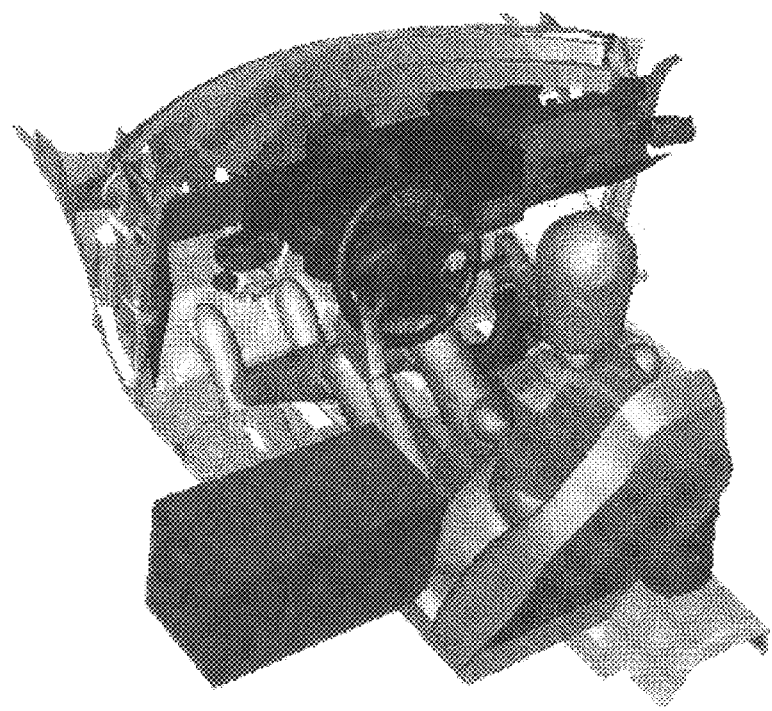
FIG. 41 is a color perspective view of an occupant representation in a vehicle showing a pelvic zone study according the present invention.
Figure 42:
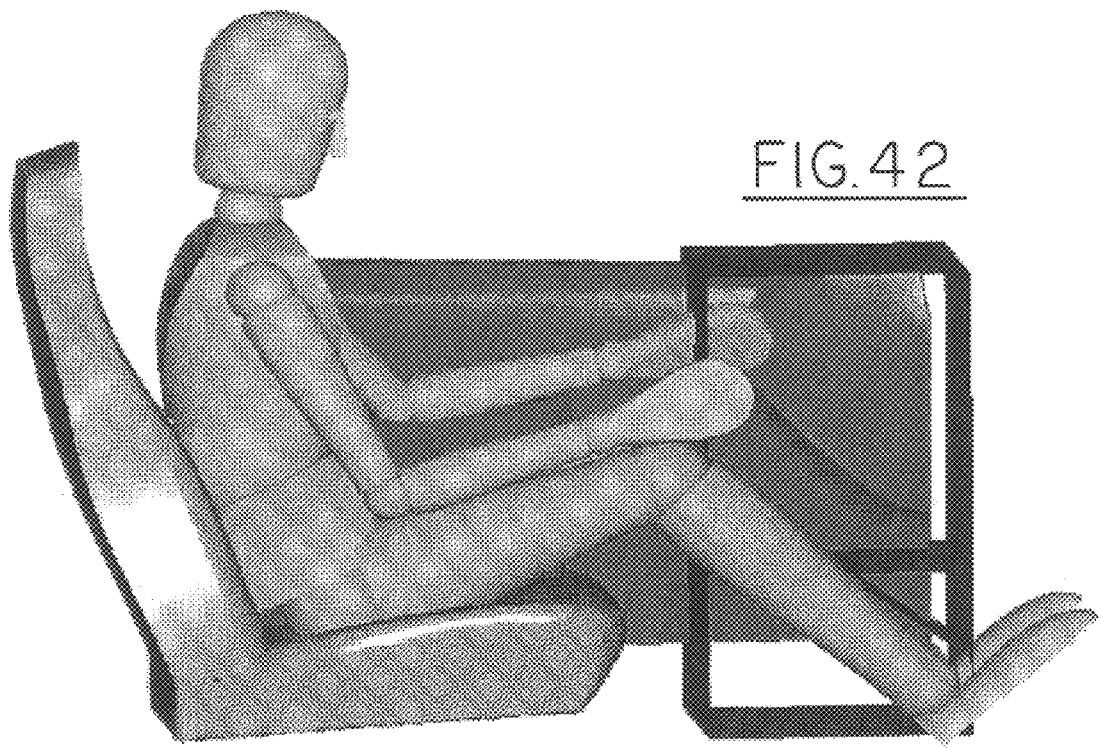
FIG. 42 is a color perspective view of an occupant representation in a vehicle showing a speaker zone placement study according the present invention.
Figure 43:
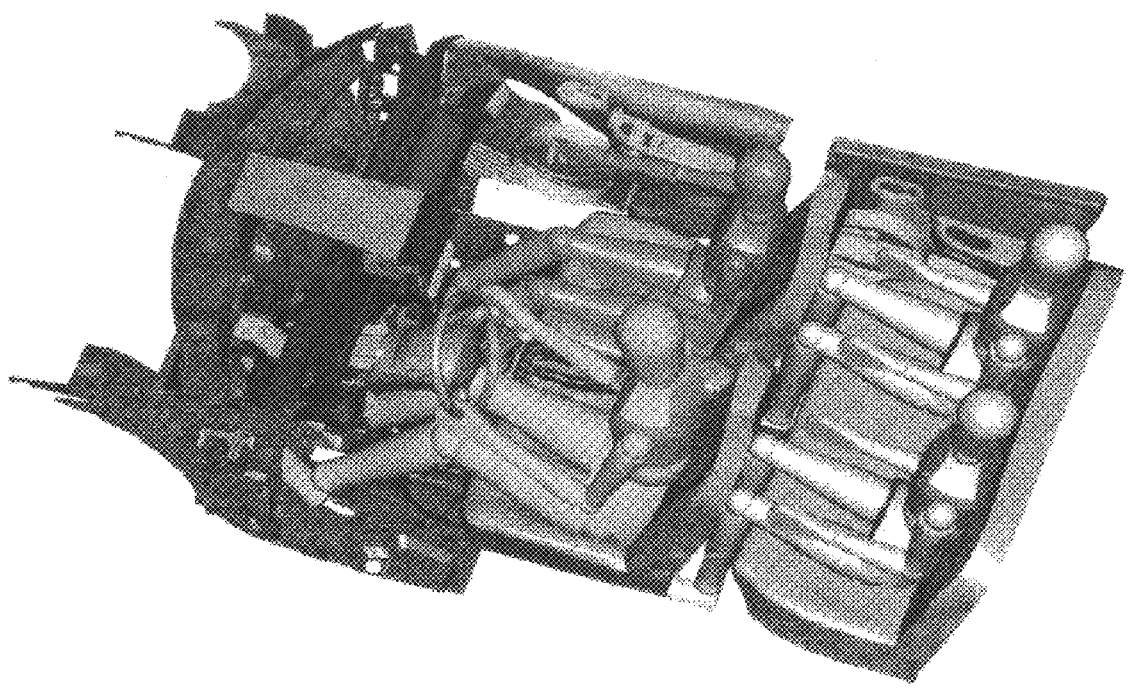
FIG. 43 is a color perspective view of several occupant representations in a vehicle showing an interior packaging study according the present invention.
Figure 44:
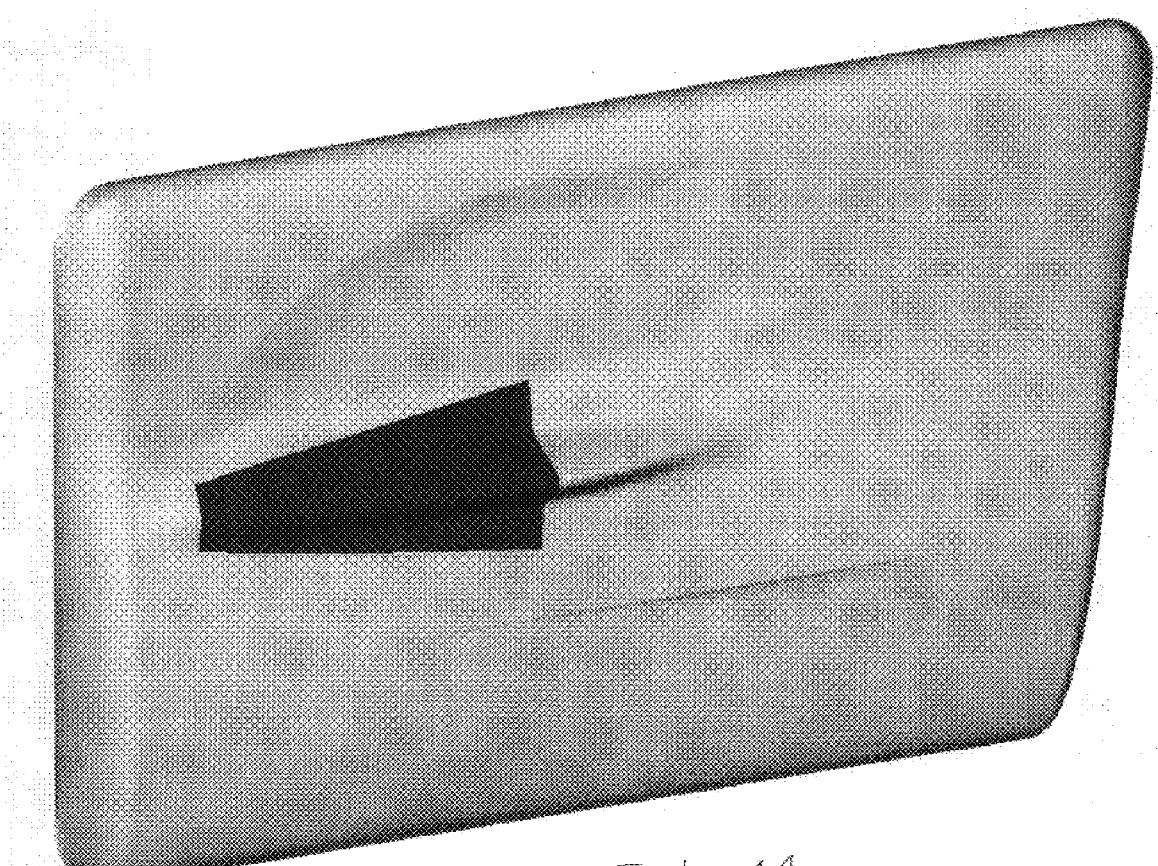
FIG. 44 is a color perspective view of a vehicle door showing a door trim armrest location study according the present invention.

The method and system of the present invention may be used with various other occupant-to-vehicle system interaction studies, including but not limited to, a leg clearance study (FIG. 40), a pelvic impact study (FIG. 41), a speaker zone location study (FIG. 42), interior occupant packaging study (FIG. 43), and a door trim optimal armrest location study (FIG. 44).

The method and system of the present invention may be used for a wide variety of occupant interaction related tasks and is not limited to that shown in FIGS. 2–44. The present invention is meant to encompass a vehicle design method and system in a computer environment for allowing a vehicle designer to determine occupant interaction interaction between computer electronic representations of the occupant and the vehicle, or systems on the vehicle, and to report the outcome of such a study to the vehicle designer.

Various human factor interaction studies may be performed in addition to, or in place of, those described above. Studies which may be performed include optimum back angle, preferred steering wheel center, arm rest surface interaction, console surface interaction, door trim interaction, torso angle, G-factor for use with interaction zone generation, manual transmission stick shift hand clearance zone, optimum neutral shift location and variation plane, and hand recommended pattern and spacing curves for stick shift location for each gear position from the optimal neutral location.

As seen in the foregoing list, there are numerous human factor studies which may be conducted to provide a vehicle designer with information for enhancing vehicle ergonomics. The present invention is not, of course, limited to those studies described above as the list is meant to be illustrative and not limiting.

While the form of the invention shown and described herein constitutes a preferred embodiment of the invention, it is not intended to illustrate all possible forms thereof. The words used are of description rather than limitation, and various changes may be made without departing from the spirit and scope of the invention as disclosed.

We claim:

1. A computer aided method for designing an interior portion of an automotive vehicle, the method comprising the steps of:
   (a) selecting a set of generic parameters for describing an occupant position in the interior portion of the vehicle and occupant interaction with respect to at least one device within the vehicle;
   (b) selecting a value for each of the set of generic parameters;
   (c) generating a spatial relationship between the occupant position and the at least one occupant device; and
   (d) determining a parameter change for at least one of the set of generic parameters so that the spatial relationship meets a predetermined criteria.

2. A method for designing an automotive vehicle according to claim 1 and further including the steps of generating and displaying at least one occupant-to-vehicle interaction surface based upon the spatial relationship so as to divide the passenger compartment into a plurality of occupant interaction zones.

3. A computer aided method for designing a portion of an automotive vehicle, the method comprising the steps of:
   (a) storing in the memory of a computer system a first set of data representing an occupant position within the vehicle;
   (b) storing in the memory a second set of data representing a position for at least one occupant interactive vehicle system within the passenger compartment;
   (c) generating a third set of data representing an interaction distance between the first set of data and the second set of data;
   (d) comparing the third set of data to a fourth set of data representing a predetermined occupant-to-vehicle interaction criteria; and
   (e) varying the second set of data until the third set of data meets the predetermined occupant-to-vehicle interaction criteria.

4. A method for designing an automotive vehicle according to claim 3 wherein the first set of data includes data representing at least one of the following:
   occupant hip point data;
   data representing a distance between an accelerator heel point and the occupant hip point; and
   occupant back angle data.

5. A method for designing an automotive vehicle according to claim 3 wherein the second set of data includes data from an electronically stored parts library.

6. A method for designing an automotive vehicle according to claim 3 wherein the fourth set of data comprises human factors data.

7. A method for designing an automotive vehicle according to claim 6 wherein the human factors data comprises data from at least one of a set of steering wheel hand clearance data, a set of arm rest data, a set of lea clearance data, a set of steering wheel finger interaction data, a set of hand brake path and clearance data, a set of hand clearance around a seat data, a set of manual shifter data, a set of multifunction stalk data, a set of pelvic positioning data, a set of door trim speaker location data, and a set of knee bolster data.

8. A method for designing an automotive vehicle according to claim 3 wherein the second set of data is varied in step (e) based upon a predefined set of rules.

9. A method according to claim 8 wherein the predefined rules comprise a set of locational relationships between the first and second sets of data.

10. A method for designing an automotive vehicle according to claim 3 including the step of generating a fifth set of data representing at least one occupant-to-vehicle interaction surface based upon the third set of data representing the occupant-to-vehicle interaction distance.

11. A method for designing an automotive vehicle according to claim 10 wherein the fifth set of data includes at least one of a steering wheel hand clearance surface, an arm rest surface, a leg clearance surface, a steering wheel finger interaction surface, a hand brake path and clearance surface, a hand clearance around a seat surface, a manual shifter surface, a multifunction stalk surface, a pelvic positioning surface, a door trim speaker location surface, and a knee bolster surface.

12. A method for designing an automotive vehicle according to claim 10 including the step of displaying the fifth set of data relative to the first and second sets of data.

13. A method for designing an automotive vehicle according to claim 10 wherein the fifth set of data is displayed so as to divide the passenger compartment into at least one of a steering wheel hand clearance zone, an arm rest zone, a leg clearance zone, a steering wheel finger interaction zone, a hand brake path and clearance zone, a seat hand clearance zone, a manual shifter zone, a multifunction stalk zone, a pelvic positioning zone, a door trim speaker location zone, and a knee bolster zone.

14. A computer aided method for designing a portion of an automotive vehicle, the method comprising the steps of:
   (a) storing in the memory of a computer system a first set of data representing an occupant position within the vehicle;
   (b) storing in the memory a second set of data representing a position for at least one occupant interactive vehicle system within the passenger compartment;

(c) generating a third set of data representing a spatial relationship between the first set of data and the second set of data;

(d) comparing the third set of data to a fourth set of data stored in the memory representing a predetermined occupant-vehicle interaction criteria; and (e) varying the second set of data until the third set of data meets the predetermined occupant-vehicle interaction criteria.

15. A system for designing a portion of an automotive vehicle, the system comprising:

(a) first code means for representing an occupant position within a passenger compartment in the vehicle;

(b) second code means for representing a position for at least one occupant interactive vehicle system within the passenger compartment;

(c) third code means for generating a spatial relationship between the occupant position and the at least one occupant interactive vehicle system;

(d) fourth code means for comparing the spatial relationship to a predetermined occupant-vehicle interaction criteria; and (e) fifth code means for varying the position of the at least one occupant interactive system to meet the predetermined occupant-vehicle interaction criteria.

16. A system according to claim 15 wherein the first code means includes at least one of the following:

code means for representing an occupant hip point;

code means for representing a distance between an accelerator heel point and the occupant hip point; and code means for representing an occupant back angle.

17. A system according to claim 15 wherein the second code means includes code means for representing a parts library.

18. A system according to claim 15 wherein the predetermined occupant-vehicle interaction criteria comprises a set of human factors interaction data.

19. A system according to claim 18 wherein the human interaction factors data comprises data from at least one of a set of steering wheel hand clearance data, a set of arm rest data, a set of leg clearance data, a set of steering wheel finger interaction data, a set of hand brake path and clearance data, a set of hand clearance around a seat data, a set of manual shifter data, a set of multifunction stalk data, a set of pelvic positioning data, a set of door trim speaker location data, and a set of knee bolster data.

20. A system according to claim 15 wherein the fifth code means includes a set of locational rules between the first and second code means.

21. A system according to claim 15 including sixth code means for displaying the spatial relationship between the occupant position and the at least one occupant interactive vehicle system.

22. A system according to claim 21 wherein the sixth code means causes the spatial relationship between the occupant position and the at least one occupant interactive vehicle system to be displayed so as to divide the passenger compartment into at least one of a steering wheel hand clearance zone, an arm rest zone, a leg clearance zone, a steering wheel finger interaction zone, a hand brake path and clearance zone, a seat hand clearance zone, a manual shifter zone, a multifunction stalk zone, a pelvic positioning zone, a door trim speaker location zone, and a knee bolster zone.

23. A computer aided vehicle design system for designing a portion of an automotive vehicle, the system comprising:

(a) parameter selection code means for selecting a value for at least one occupant position parameter;

(b) spatial code means for determining an interaction distance between the at least one occupant position parameter and at least one vehicle device;

(c) comparison code means for comparing the interaction distance to a predetermined criteria; and (d) adjustment code means for determining a locational change for the at least one vehicle device so that the interaction distance meets the predetermined criteria.

24. A system according to claim 23 wherein the adjustment code means includes code means for varying a device location of the at least one vehicle device with respect to the at least one occupant position parameter based upon a set of predefined rules.

25. A system according to claim 24 wherein the predefined rules are defined by locational code means comprising a set of locational relationships between each of the at least one vehicle devices.

26. A system according to claim 25 wherein the locational code means comprises a standard parts library electronicaly stored in a computer memory.

27. A system according to claim 23 wherein the predetermined criteria are embodied in a human factors code means.

28. A system according to claim 27 wherein the human factors code means includes at least one of a steering wheel hand clearance criteria code means, an arm rest criteria code means, a leg clearance criteria code means, a steering wheel finger interaction criteria code means, a hand brake path and clearance criteria code means, a seat hand clearance criteria code means, a manual shifter criteria code means, a multifunction stalk criteria code means, a pelvic positioning criteria code means, a door trim speaker location criteria code means, and a knee bolster criteria code means.

29. A system according to claim 23 including display means for displaying a geometric representation of the interaction distance between the occupant representation and the at least one vehicle device.

30. A system according to claim 29 wherein the geometric representation is a surface which divides the passenger compartment into at least two zones.

31. A vehicle design system on a computer in which an occupant representation and at least one vehicle system have a common reference point, the system comprising:

occupant representation means for orienting an occupant representation with respect to the common reference point in the computer;

vehicle system representation means for representing in the computer at least one vehicle system with reference to the common reference point;

interaction study means for performing at least one human factors interaction study between the occupant representation and the at least one vehicle system; and outcome communication means for reporting an outcome of the at least one human factors interaction study.

32. A vehicle design system on a computer having processor and a memory in which an occupant and at least one vehicle system are electronically represented with respect to a common reference point in a three-dimensional representation of a portion of a vehicle, the system comprising:

occupant representation code means for orienting an occupant representation with respect to the common reference point in the computer;

vehicle system representation code means for representing the at least one vehicle system with reference to the common reference point;

interaction study code means for causing the processor to perform at least one human factors interaction study between the occupant representation and the at least one vehicle system; and outcome communication code means for reporting an outcome of the at least one human factors interaction study.

33. A method for designing an automotive vehicle in a computer system in which a portion of a vehicle, an occupant representation, and at least one occupant interactive vehicle surface are electronically represented, the method comprising the steps of:

(a) orienting the occupant representation within a passenger compartment in the vehicle;

(b) positioning the at least one occupant interactive vehicle surface within the passenger compartment;

(c) generating at least one occupant interaction surface based upon a predetermined occupant interaction criteria; and (d) displaying said at least one surface so as to divide the passenger compartment into at least one occupant interaction zone.

34. A method for designing an automotive vehicle according to claim 33 wherein the occupant representation is oriented using a predefined set of occupant orientation parameters.

35. A method for designing an automotive vehicle according to claim 34 wherein the predefined set of occupant orientation parameters include at least one of the following:

an occupant hip point;

a distance between an accelerator heel point and the occupant hip point; and an occupant back Angle.

36. A method for designing an automotive vehicle according to claim 33 wherein the at least one occupant interactive vehicle surface is defined in an electronically stored parts library.

37. A method for designing an automotive vehicle according to claim 33 wherein the predetermined occupant interaction criteria comprise a set of human interaction factors.

38. A method for designing an automotive vehicle according to claim 37 wherein the set of human interaction factors comprise at least one of a steering wheel hand clearance criteria, an arm rest criteria, a leg clearance criteria, a steering wheel finger interaction criteria, a hand brake path and clearance criteria, a seat hand clearance criteria, a manual shifter criteria, a multifunction stalk criteria, a pelvic positioning criteria, a door trim speaker location criteria, and a knee bolster criteria.

39. A method for designing an automotive vehicle according to claim 33 wherein the at least one occupant interaction surface comprises at least one of a steering wheel hand clearance surface, an arm rest surface, a leg clearance surface, a steering wheel finger interaction surface, a hand brake path and clearance surface, a hand clearance around a seat surface, a manual shifter surface, a multifunction stalk surface, a pelvic positioning surface, a door trim speaker location surface, and a knee bolster surface.

40. A method for designing an automotive vehicle according to claim 33 wherein the at least one occupant interaction zone comprises at least one of a steering wheel hand clearance zone, an arm rest zone, a leg clearance zone, a steering wheel finger interaction zone, a hand brake path and clearance zone, a seat hand clearance zone, a manual shifter zone, a multifunction stalk zone, a pelvic positioning zone, a door trim speaker location zone, and a knee bolster zone.

41. A method for designing an automotive vehicle according to claim 33 and further including the step of repositioning the at least one occupant interactive vehicle surface within the passenger compartment after step (d) based upon a predefined set of rules.

42. A method according to claim 41 wherein the predefined rules comprise a set of locational relationships between each of the at least one occupant interactive vehicle surfaces and adjacent occupant interactive vehicle surfaces and the portion of the vehicle electronically represented.

43. A computer aided method for designing a portion of an interior of an automotive vehicle in which an occupant position and at least one vehicle device are electronically represented, the method comprising the steps of:

(a) selecting a value for the at least one occupant position parameter;

(b) determining a spatial relationship between the at least one occupant position parameter and the at least one vehicle device;

(c) comparing the spatial relationship to a predetermined criteria; and (d) determining a locational change for the at least one vehicle device so that the spatial relationship meets the predetermined criteria.

44. A method for designing an automotive vehicle according to claim 43 wherein the occupant parameters at least one of the following:

an occupant hip point;

a distance between an accelerator heel point and the occupant hip point: and an occupant back Angle.

45. A method for designing an automotive vehicle according to claim 43 wherein the at least one vehicle device is defined in an electronically stored parts library.

46. A method for designing an automotive vehicle according to claim 43 wherein the predetermined criteria comprise a set of human interaction factors including at least one of a steering wheel hand clearance criteria, an arm rest criteria, a leg clearance criteria, a steering wheel finger interaction criteria, a hand brake path and clearance criteria, a seat hand clearance criteria, a manual shifter criteria, a multifunction stalk criteria, a pelvic positioning criteria, a door trim speaker location criteria, and a knee bolster criteria.

47. A method for designing an automotive vehicle according to claim 43 and further including the step of repositioning the at least one vehicle device within the interior based upon the locational change.

48. A method for designing an automotive vehicle according to claim 47 wherein the locational change is partially determined by a set of locational relationships between each of the at least one vehicle device, adjacent vehicle devices, and the interior portion of the vehicle.

49. A computer aided method for designing an interior portion of an automotive vehicle, the method comprising the steps of:

(a) selecting a set of generic parameters for describing an occupant position in the interior portion of the vehicle and occupant interaction with respect to at least one device within the vehicle;

(b) selecting a value for each of the set of generic parameters;

(c) generating a occupant-to-vehicle relationship between the occupant position and the at least one occupant device; and (d) determining a parameter change for at least one of the set of generic parameters so that the visual relationship meets a predetermined criteria.

50. A method for designing an automotive vehicle according to claim 49 and further including the steps of generating and displaying at least one occupant-to-vehicle surface based upon the occupant-to-vehicle relationship so as to divide the passenger compartment into a plurality of occupant interaction zones.

51. A method for vehicle design on a computer having processor and a memory in which an occupant and at least one vehicle system are electronically represented with respect to a common reference point in a three-dimensional representation of a portion of a vehicle, the method comprising the steps of:

orienting an occupant representation with respect to the common reference point in the computer;

representing the at least one vehicle system with reference to the common reference point;

determining at least one occupant-to-vehicle interaction between the occupant representation and the at least one vehicle system; and reporting the at least one occupant-to-vehicle interaction.

52. A method according to claim 51 wherein the occupant-to-vehicle interaction is determined based on a set of human factors interaction criteria.

53. A method for designing an automotive vehicle according to claim 52 wherein the set of human factors interaction criteria comprise at least one of a steering wheel hand clearance criteria, an arm rest criteria, a leg clearance criteria, a steering wheel finger reach criteria, a hand brake path and clearance criteria, a seat hand clearance criteria, a manual shifter criteria, a multifunction stalk criteria, a pelvic positioning criteria, a door trim speaker location criteria, and a knee bolster criteria.

54. A method according to claim 51 wherein the occupant-to-vehicle interaction is reported by displaying a geometric interaction representation of the occupant-to-vehicle interaction between the occupant representation and the at least one vehicle device.

55. A method according to claim 54 wherein the geometric interaction representation is a surface which divides the passenger compartment into at least two interaction zones.

56. A method according to claim 51 including the step of rendering a three-dimensional surface for the occupant interaction representation, each of the at least one vehicle devices, and the portion of the vehicle.

57. A method according to claim 51 including the step of animating movement of the occupant interaction representation, at least one vehicle device, and the portion of the vehicle.

58. A method according to claim 52 including the step of determining a locational change for the at least one vehicle device, the occupant representation, or both, so that the occupant interaction meets the predetermined interaction criteria.

59. A method according to claim 58 including the step of varying a device location of the at least one vehicle device with respect to the common reference point so that the occupant interaction meets the predetermined interaction criteria.

60. A method according to claim 52 including the step of varying a device representation of the at least one vehicle device so that the occupant interaction meets the predetermined interaction criteria.

61. A method according to claim 60 wherein the device representation is selected from an electronically stored standard parts library.

62. A method according to claim 58 including the step of regenerating a vehicle design after making the locational change by changing at least one effected dimension of one of the at least one vehicle systems and the portion of the vehicle as required by the locational change.

63. A method according to claim 62 including the step of automatically selecting parts from an electronic parts library as a substitute for at least one vehicle system to meet a vehicle system change required by the locational change.

* * * * *